United States Patent
Zhu et al.

(10) Patent No.: US 11,251,183 B2
(45) Date of Patent: Feb. 15, 2022

(54) SEMICONDUCTOR ARRANGEMENT HAVING CONTINUOUS SPACERS AND METHOD OF MANUFACTURING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Yanbo Zhang, Beijing (CN); Huicai Zhong, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/039,755

(22) Filed: Sep. 30, 2020

(65) Prior Publication Data
US 2021/0020639 A1    Jan. 21, 2021

Related U.S. Application Data

(63) Continuation-in-part of application No. 16/461,330, filed as application No. PCT/CN2016/111274 on Dec. 21, 2016, now Pat. No. 10,833,086.

(30) Foreign Application Priority Data

Nov. 15, 2016    (CN) .......................... 201611033447.4

(51) Int. Cl.
*H01L 27/092* (2006.01)
*H01L 29/66* (2006.01)
(Continued)

(52) U.S. Cl.
CPC .. *H01L 27/0924* (2013.01); *H01L 21/823431* (2013.01); *H01L 21/823468* (2013.01);
(Continued)

(58) Field of Classification Search
CPC .................................................... H01L 27/0924
(Continued)

(56) References Cited

U.S. PATENT DOCUMENTS 9,245,883 B1 *   1/2016   Lin ................... H01L 21/28008
10,460,995 B2 *  10/2019  Tsai .................. H01L 29/66545

* cited by examiner

*Primary Examiner* — Ajay Arora
(74) *Attorney, Agent, or Firm* — Christensen, Fonder, Dardi & Herbert PLLC

(57) ABSTRACT

A semiconductor arrangement includes: a substrate; fins formed on the substrate and extending in a first direction; gate stacks formed on the substrate and each extending in a second direction crossing the first direction to intersect at least one of the fins, and dummy gates composed of a dielectric and extending in the second direction; spacers formed on sidewalls of the gate stacks and the dummy gates; and dielectric disposed between first and second ones of the gate stacks in the second direction to electrically isolate the first and second gate stacks. The dielectric is disposed in a space surrounded by respective spacers of the first and second gate stacks which extend integrally. At least a portion of an interval between the first and second gate stacks in the second direction is less than a line interval achievable by lithography in a process of manufacturing the semiconductor arrangement.

21 Claims, 35 Drawing Sheets

(51) Int. Cl.
*H01L 21/8234* (2006.01)
*H01L 29/78* (2006.01)
(52) U.S. Cl.
CPC ...... *H01L 29/6656* (2013.01); *H01L 29/6681* (2013.01); *H01L 29/7851* (2013.01)
(58) Field of Classification Search
USPC ........................................................ 257/192
See application file for complete search history.

SEMICONDUCTOR ARRANGEMENT HAVING CONTINUOUS SPACERS AND METHOD OF MANUFACTURING THE SAME

CROSS-REFERENCE TO RELATED APPLICATION(S)

This application is a Continuation-in-Part of U.S. patent application Ser. No. 16/561,330, filed May 15, 2019, which is a U.S. national phase application of PCT Application No. PCT/CN2016/111274, filed on Dec. 21, 2016, entitled "SEMICONDUCTOR STRUCTURE HAVING CONTINUOUS SPACERS AND MANUFACTURING METHOD THEREFOR" which claims priority to Chinese Patent Application No. 201611033447.4, entitled "Semiconductor Arrangement Having Continuous Spacers and Method of Manufacturing the Same" and filed on Nov. 15, 2016, which are incorporated herein by reference in their entirety.

FIELD

The present disclosure relates to the field of semiconductors, and more particularly, to a semiconductor arrangement having continuous spacers, a method of manufacturing the same, and an electronic device including the semiconductor arrangement.

BACKGROUND

As semiconductor devices continue to be miniaturized, short channel effects become more pronounced. In this regard, a three-dimensional device, i.e., Fin Field Effect Transistor (FinFET), has been proposed. The FinFET typically includes a vertical fin on a substrate and a gate stack intersecting the fin. Channels may be formed on sidewalls of the fin.

In order to form FinFETs, ridges may be formed on the substrate to extend continuously. Depending on a layout design, these continuously extending ridges may be patterned into different portions which subsequently form fins of the respective devices. In addition, gate lines may be formed on the substrate to extend continuously. Depending on the layout design, these continuously extending gate lines may be patterned into separate portions which subsequently form gates of the respective devices. A spacer may be formed on sidewalls of each of the gates of the device to surround the corresponding gate.

FIG. 1 is a top view showing a conventional semiconductor arrangement including FinFETs.

As shown in FIG. 1, the semiconductor arrangement includes a plurality of fins 101 extending in a first direction (for example, a horizontal direction in the figure) on a substrate and a plurality of gate stacks 103-1 extending in a second direction (for example, a vertical direction in the figure) crossing (for example, perpendicular to) the first direction. The gate stack may include, for example, a gate dielectric layer and a gate electrode layer. Channels may be created at positions where the fins intersect the gate stacks, and source and drain regions may be formed on opposite sides of the respective channel regions of the fins respectively (thereby resulting in the FinFETs). A spacer 105 is formed on sidewalls of each of the gate stacks 103-1 to surround the corresponding gate stack 103-1.

In addition, a dummy gate 103-2 may be formed for convenience of patterning, electrical isolation, or the like. The dummy gate 103-2 may include the same configuration as that of the gate stacks 103-1, so as to be formed together with the gate stacks 103-1 (and thus, it is also possible to form a spacer on sidewalls of the dummy gate 103-2 to surround the dummy gate 103-2). However, the dummy gate 103-2 may not intersect the continuous fins and thus does not actually constitute a true device. For example, in an example of FIG. 1, the dummy gate 103-2 is formed to intersect gaps between the respective fins 101 in the first direction.

Dielectric, such as Inter-Layer Dielectric (ILD) (not shown in the figure for clarity) such as oxide, may be filled in gaps between the respective spacers 105 on the substrate, particularly in a case of a gate-last process. The ILD may have its top surface substantially flush with top surfaces of the gate stacks 103-1, the dummy gate 103-2, and the spacers 105 by, for example, a planarization process such as Chemical Mechanical Polishing (CMP).

In order to cope with the trend of miniaturization, the self-aligned contact technology may be adopted. For example, contact holes may be etched in the ILD, and may extend between opposing spacers. Then, a contact material, for example, metal such as tungsten (W), may be deposited on the substrate and planarized by, for example, CMP. The CMP may stop at the ILD or the spacers. After the CMP, the contact material is filled in the contact holes to form contacts 107. Contacts on opposite sides (left and right sides in the figure) of the dummy gate 103-2 may be electrically separated by the spacer 105 of the dummy gate 103-2.

However, this structure has the following disadvantages. When the ILD is etched (for example, isotropically etched), it is possible to form gaps in the ILD between opposing ends of opposing gate stacks 103-1. These gaps may then be filled with the contact material, which causes unnecessary electrical short circuits between the respective contacts, as indicated by 107X in FIG. 1. In addition, as indicated by arrows in FIG. 1, edges of the dummy gate 103-2 are not aligned with ends of the fins 101, which may cause increase in an interval between ends of the gates, thereby reducing the integration density.

There is a need to provide a new structure and process to at least partially address the above problems.

SUMMARY

In view of the above, the present disclosure aims to provide, among others, a semiconductor arrangement, a method of manufacturing the same, and an electronic device including such a semiconductor arrangement, in which spacers may extend continuously in an extending direction of gates.

According to an aspect of the present disclosure, there is provided a semiconductor arrangement, comprising: a substrate; a plurality of fins formed on the substrate and extending in a first direction; a plurality of gate stacks formed on the substrate and extending in a second direction crossing the first direction and dummy gates composed of dielectric and extending in the second direction, wherein each of the gate stacks intersects at least one of the fins; spacers formed on sidewalls of the gate stacks and sidewalls of the dummy gates; and dielectric disposed between a first one and a second one of the gate stacks which are aligned in the second direction to electrically isolate the first gate stack from the second gate stack, wherein the first gate stack and the second gate stack have their respective spacers extending integrally, and the dielectric is disposed in a space surrounded by the spacers of the first gate stack and the second gate stack which extend integrally, and wherein at least a portion of an interval between the first gate stack and the second gate stack in the second direction is less than a line interval achievable by lithography in a process of manufacturing the semiconductor arrangement.

According to another aspect of the present disclosure, there is provided a method of manufacturing a semiconductor arrangement, comprising: forming, on a substrate, a plurality of ridges each continuously extending in a first direction; forming, on the substrate, a plurality of sacrificial gate lines each extending continuously in a second direction crossing the first direction to intersect the plurality of ridges; forming a spacer on sidewalls of each of the sacrificial gate lines to surround the sacrificial gate line; forming first dielectric on the substrate, and planarizing the first dielectric to expose the sacrificial gate lines; removing the sacrificial gate lines to expose the underlying ridges; filling spaces within the spacers with second dielectric; shielding a portion of the second dielectric with a mask and exposing remaining portions of the second dielectric, wherein the mask covers a portion of the second dielectric of a certain dimension in the second direction at at least one of the sacrificial gate lines; removing the exposed portions of the second dielectric to expose the underlying ridges; and forming gate stacks in a space left by the removal of the portions of the second dielectric, wherein at the at least one of the sacrificial gate lines, the portion of the second dielectric of the dimension remains, and an interval between gate stacks formed on opposite sides of the remaining portion of the second dielectric in the second direction is defined by the dimension and can therefore be less than a line interval achievable by lithography in a process of manufacturing the semiconductor arrangement.

According to yet another aspect of the present disclosure, there is provided a method of manufacturing a semiconductor arrangement, comprising: forming, on a substrate, a plurality of ridges each continuously extending in a first direction; forming, on the substrate, a plurality of sacrificial gate lines each extending continuously in a second direction crossing the first direction to intersect the plurality of ridges; forming a spacer on sidewalls of each of the sacrificial gate lines to surround the sacrificial gate line; forming first dielectric on the substrate, and planarizing the first dielectric to expose the sacrificial gate lines; removing the sacrificial gate lines to expose the underlying ridges; filling spaces within the spacers with second dielectric; shielding a portion of the second dielectric with a first mask and exposing a first portion of the second dielectric; removing the exposed first portion of the second dielectric to expose the underlying ridges; forming a first gate stack in a space left by the removal of the first portion of the second dielectric; shielding a portion of the second dielectric with a second mask and exposing a second portion of the second dielectric, wherein there is an overlay between the first mask and the second mask of a certain dimension in the second direction at at least one of the sacrificial gate lines; removing the exposed second portion of the second dielectric to expose the underlying ridges; forming a second gate stack in a space left by the removal of the second portion of the second dielectric, wherein, at the at least one of the sacrificial gate lines, a portion of the second dielectric of the dimension remains, and an interval between the first gate stack and the second gate stack formed on opposite sides of the remaining portion of the second dielectric is defined by the dimension and can therefore be less than a Critical Dimension (CD) achievable by photolithography in a process of manufacturing the semiconductor arrangement.

According to a further aspect of the present disclosure, there is provided an electronic device, comprising the semiconductor arrangement described above.

According to embodiments of the present disclosure, the spacers may extend continuously across opposing (dummy) gates, even if the (dummy) gates are not continuous. This contributes to avoid electrical shorts between (self-aligned) contacts. The interval between the ends of the gate stacks is defined by using mask lines (rather than an interval between the mask lines), and thus can have a dimension less than a line interval achievable by lithography in the manufacturing process. On the other hand, the dielectric for isolation between the ends of the gate stacks is defined by using the overlay between masks (rather than the mask lines), and thus can have a dimension less than a CD achievable by the lithography. In addition, the ends of the fins abutting the dummy gates may be self-aligned to inner walls of corresponding ones of the spacers, thereby contributing to increase in integration density.

BRIEF DESCRIPTION OF THE DRAWINGS

The above and other objects, features and advantages of the present disclosure will become more apparent from the following descriptions of embodiments of the present disclosure with reference to the attached drawings, in which.

Figure 1:
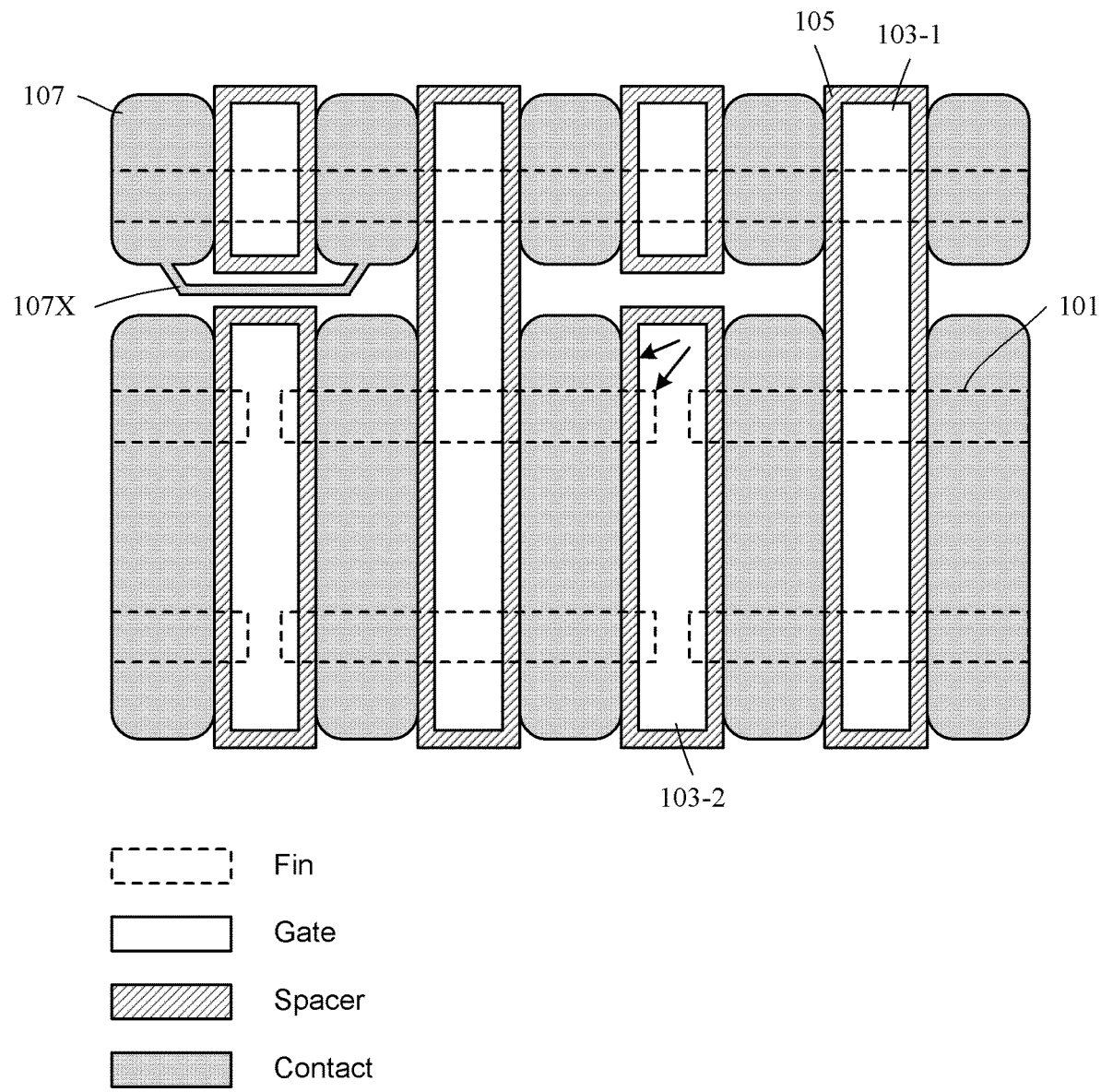
FIG. 1 is a top view showing a conventional arrangement including FinFETs.

Throughout the attached drawings, the same or similar reference signs indicate the same or similar components.

DETAILED DESCRIPTION

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, ridges each may be formed on a substrate to extend in a first direction, and gate lines each may be formed on the ridges to extend continuously in a second direction crossing (for example, substantially perpendicular to) the first direction to intersect the respective ridges. After that, a spacer may be formed on sidewalls of each of the gate lines to surround the gate line. Thus, the spacers may extend continuously over a length of the respective gate lines (in the second direction). Here, the ridges may be patterned according to a design layout before the gate lines are formed. Alternatively, the gate lines may be formed directly on the continuously extending ridges, and the ridges may then be patterned according to the design layout in subsequent steps, as described below. Hereinafter, the latter case will be described by way of example.

In addition, the gate-last process is actually adopted here in consideration of the continuously extending spacers, and in such a process first dielectric (for example, Inter-Layer Dielectric (ILD)) may be formed on the substrate. The first dielectric may be planarized to expose the gate lines (for example, the planarization may stop at the gate lines).

After the continuously extending spacers are formed, the gate lines may be separated (and the ridges may be separated if they are not separated previously). For example, the gate lines may be removed (thus such gate lines may be referred to as "sacrificial" gate lines). The underlying ridges are exposed by the removal of the sacrificial gate lines. Depending on the layout design, the ridges may be separated in some regions (this may be omitted if the ridges have been separated before the gate lines are formed). For example, some of exposed portions of the ridges may be selectively etched through spaces surrounded by the respective spacers to separate the respective ridges into different portions (which are separated in terms of electricity, but may still be partially continuous physically). These portions then form fins for different devices. These portions, i.e., the fins, may have their ends self-aligned to inner walls of the respective spacers. Then, second dielectric may be filled into spaces within the spacers, so that the different portions of the ridges may be electrically isolated from each another.

Depending on the layout design, the second dielectric within the spacers may be removed at positions where true gate stacks are to be formed, to expose the underlying ridges or fins. The gate stacks may then be formed in spaces left by the removal of the second dielectric. Thus, the gate stacks may intersect the underlying fins and thus form the corresponding devices, i.e., FinFETs. The second dielectric left within the spacers may form dummy gates.

Thus, spacers on sidewalls of ones of the gate stacks which are aligned in the second direction (those occupying a position of the same sacrificial gate line and surrounded by the same spacer) may integrally extend continuously, even if the gate stacks are not contiguous to each other. Thus, it is possible to avoid the occurrence of the short circuits 107X passing between the ends of the gates as shown in FIG. 1. Further, as described above, the ends of the fins may be self-aligned to the inner walls of the respective spacers. Thus, the reduction in integration density due to misalignment between the ends of the fins and the edges of the gates as shown in FIG. 1 may be avoided.

According to embodiments of the present disclosure, when the second dielectric is removed, intervals between ends of the respective gates and the dielectric filled in the intervals may be scaled down by appropriately using a mask. For example, the second dielectric may be shielded by the mask. Portions of the second dielectric of a certain dimension may be shielded by the mask at intervals between ends of some of the gates. Thus, after the second dielectric is selectively etched by using the mask, the portions of the second dielectric of the dimension may remain. Therefore, an interval between ends of gate stacks formed on opposite sides of each of the remaining portions of the second dielectric may be defined by the dimension and thus may be less than a line interval achievable by lithography in the manufacturing process. For further example, different portions of the second dielectric may be shielded by different masks at different times to selectively etch different regions of the second dielectric, respectively. There may be an overlay between the respective masks. Due to the overlay, portions of the second dielectric of a certain dimension may be left, which dimension may be less than a Critical Dimension (CD) achievable by lithography in the manufacturing process.

Figure 2:
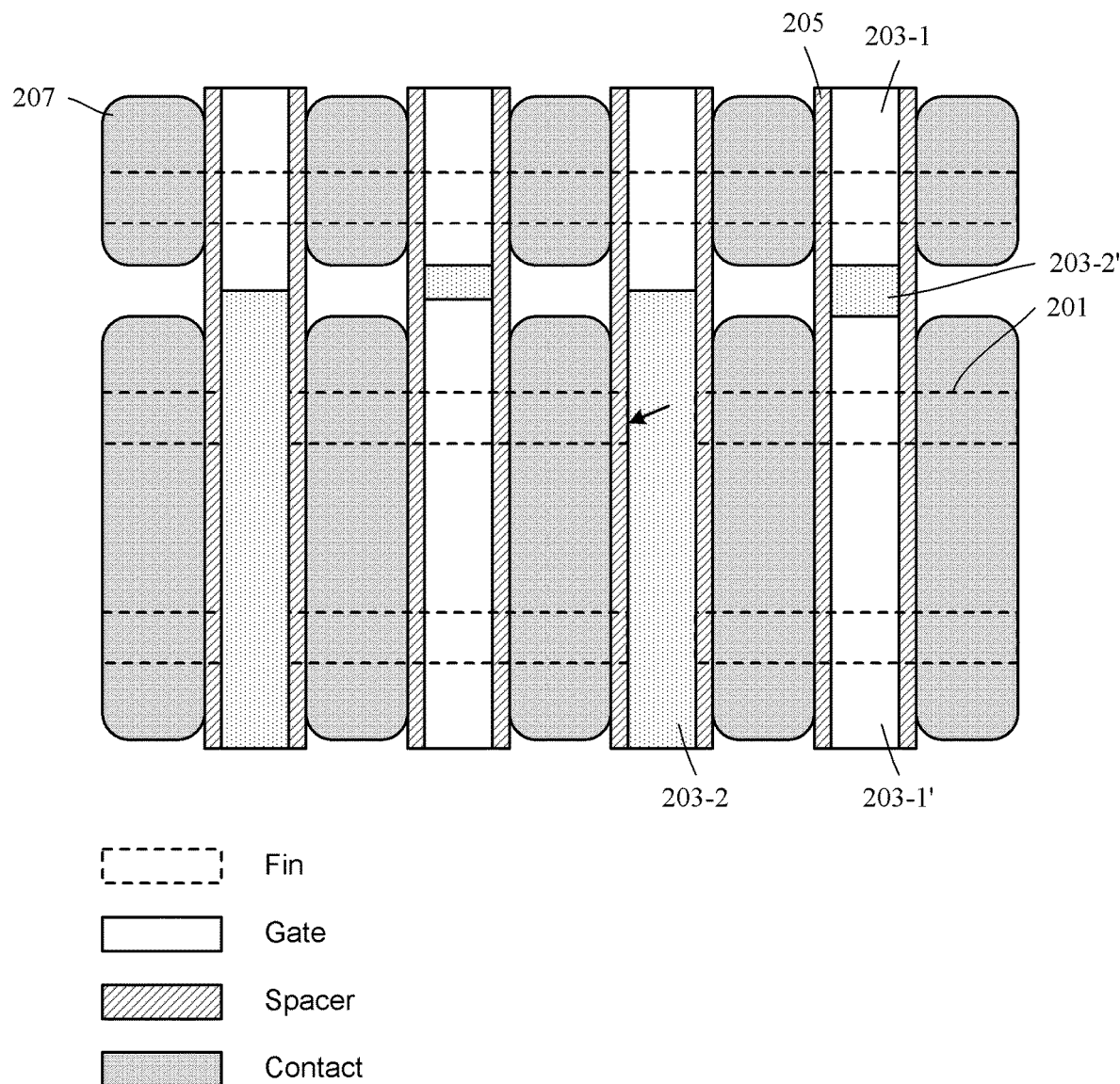
FIG. 2 is a top view showing a semiconductor arrangement according to an embodiment of the present disclosure.

FIG. 2 is a top view showing a semiconductor arrangement according to an embodiment of the present disclosure. The semiconductor arrangement is manufactured, for example, according to the above process.

As shown in FIG. 2, the semiconductor arrangement according to the present embodiment may include a plurality of fins 201 extending in a first direction (for example, a horizontal direction in the figure) on a substrate and a plurality of gate stacks 203-1, 203-1' and a plurality of dummy gates 203-2 extending in a second direction (for example, a vertical direction in the figure) crossing (for example, perpendicular to) the first direction. The gate stacks 203-1, 203-1' may each include a gate dielectric layer and a gate electrode layer. In addition, the dummy gates 203-2 may each include dielectric (for example, the second dielectric described above). Spacers 205 are formed on sidewalls of the gate stacks and the dummy gates. In practice, the spacers 205 may each have a ring structure. In FIG. 2, upper and lower ends of the spacers 205 are not shown for convenience (they may be considered as being outside the region shown in the figure). Corresponding ones of the gate stacks and/or dummy gates within one same spacer 205 are aligned with each other along an extending direction (i.e., the second direction) of the spacer 205 (the corresponding gate stacks and/or dummy gates together occupy a position of a sacrificial gate line originally surrounded by the spacer).

The gate stacks 203-1, 203-1' intersect the fins 201 to form corresponding devices, i.e., FinFETs. In this example, since ends of each of the fins 201 are aligned with inner walls of corresponding ones of the spacers 205 as indicated by the arrow in the figure, the dummy gates 203-2 actually do not intersect the fins, and each of the dummy gates 203-2 electrically isolates opposing fins on opposite sides thereof (left and right sides in the figure) from each other.

Depending on a layout design, isolation sections 203-2' may be disposed between opposing ones of the gate stacks 203-1 and 203-1'. The isolation sections 203-2' may include the same dielectric as that of the dummy gates 203-2 by, for example, leaving the second dielectric in regions where the isolation sections are to be formed in the above described process.

In addition, the semiconductor arrangement further includes contacts 207 formed in a self-alignment manner. The contacts 207 may each extend between adjacent ones of the spacers 205. Since the spacers 205 extend continuously, contacts 207 on opposite sides of the same spacer 205 may be electrically isolated from each other reliably by the continuously extending spacer 205.

The present disclosure may be implemented in various forms, and some examples thereof will be described below.

FIGS. 3(a)-23(b) are schematic views showing a flow of manufacturing a semiconductor arrangement according to an embodiment of the present disclosure.

Figure 3A:
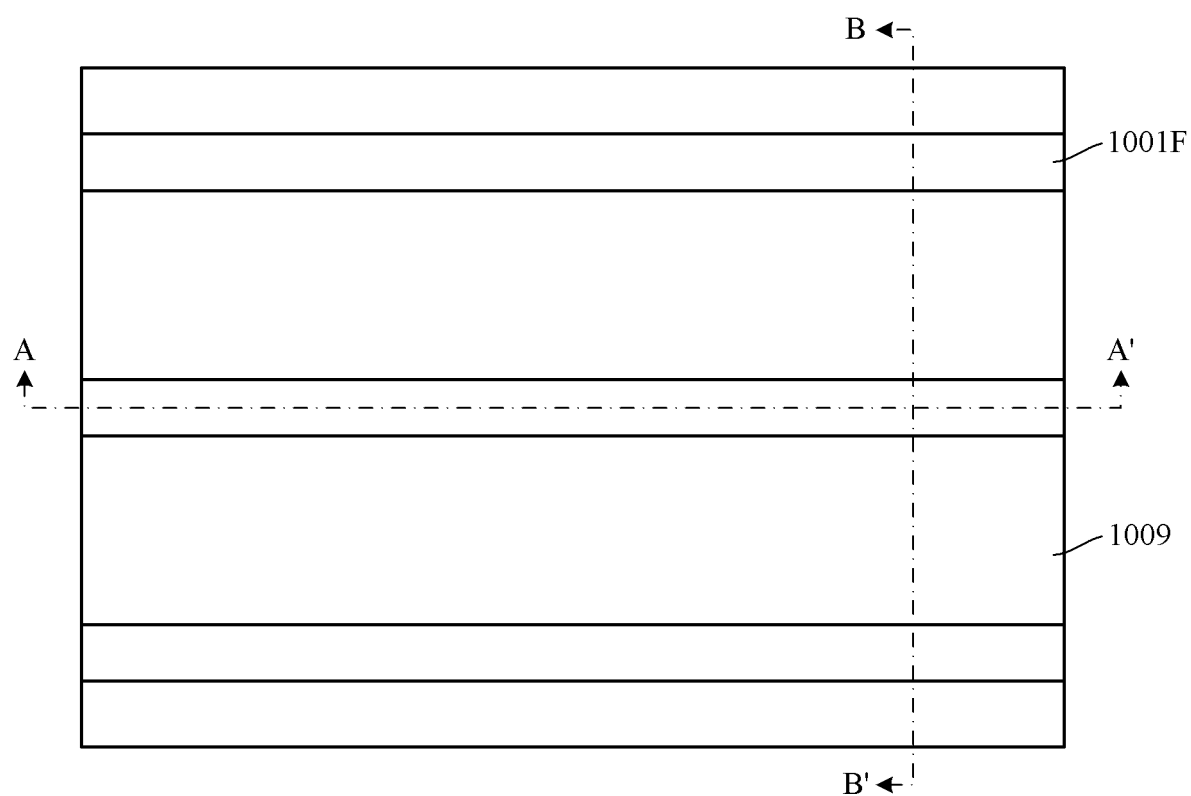
FIGS. 3(a)-23(b) are schematic views showing a flow of manufacturing a semiconductor arrangement according to an embodiment of the present disclosure.
Figure 3B:
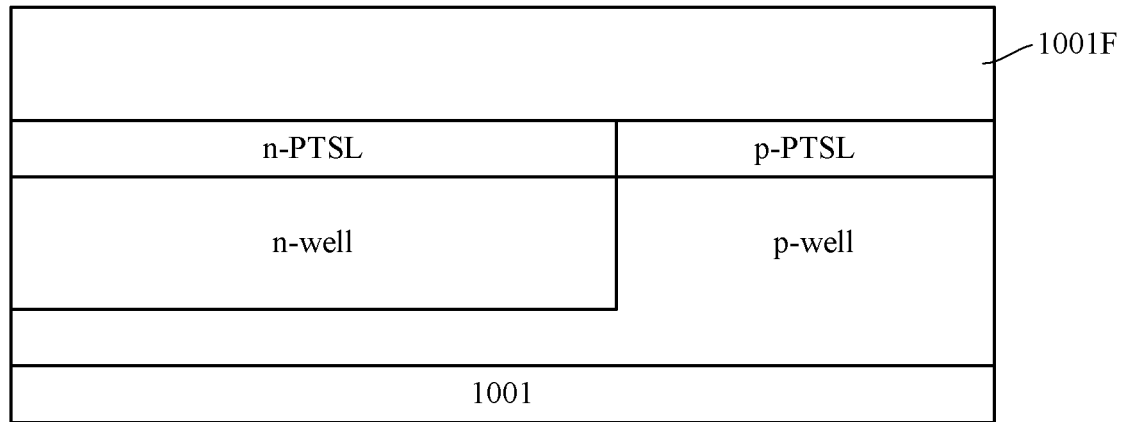
Figure 3C:
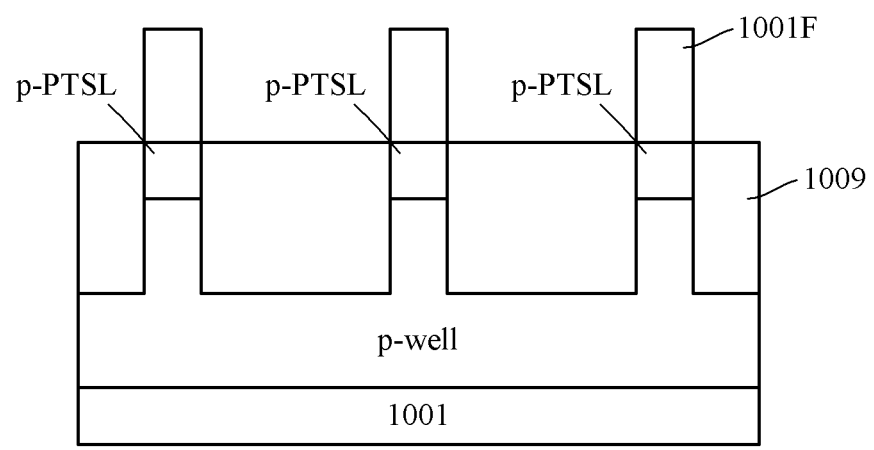

As shown in FIGS. 3(a), 3(b) and 3(c) (FIG. 3(a) is a top view, FIG. 3(b) is a cross-sectional view taken along line AA' in FIG. 3(a), and FIG. 3(c) is a cross-sectional view taken along line BB' in FIG. 3(a)), a substrate 1001 is provided. The substrate 1001 may be various forms of substrates including, but not limited to, a bulk semiconductor material substrate such as a bulk Si substrate, a Semiconductor-On-Insulator (SOI) substrate, a compound semiconductor substrate such as an SiGe substrate, or the like. In the following description, a bulk Si substrate will be described by way of example for convenience of explanation.

Various well regions, such as a p-well and an n-well as shown in the figure, may be formed in the substrate 1001 by, for example, ion implantation. In this example, the p-well may be formed over the entire substrate and the n-well may be embedded in a portion of the p-well. For example, an n-type device may be formed on the p-well, and a p-type device may be formed on the n-well.

Further, ridges 1001F extending in a first direction (for example, a horizontal direction in FIGS. 3(a) and 3(b), or a direction perpendicular to the sheet in FIG. 3(c)) are formed on the substrate 1001. For example, grooves may be formed in the substrate 1001 by patterning the substrate 1001, and portions between adjacent ones of the grooves protrude with respect to the grooves to form the ridges. Certainly, it is also possible to epitaxially grow other semiconductor layer(s) on the substrate and form the ridges by patterning the semiconductor layer(s). The ridges 1001F may extend in parallel and may have the same or different pitch(es) therebetween and/or width(s).

An isolation layer 1009 of, for example, oxide (for example, silicon oxide), may be formed on the substrate 1001 to be filled in the grooves to surround the bottom of the ridges 1001F. Portions of the ridges 1001F above a top surface of the isolation layer 1009 may then constitute fins of devices, and thus are referred to here as "fin lines". In the following description, the fin lines are also indicated by "1001F". Certainly, in a case of an SOI substrate, a Buried OXide (BOX) layer of the SOI substrate may serve as the isolation layer.

According to an embodiment of the present disclosure, the fin lines may be separated into different portions to form a layout of fins before the isolation layer is formed to define active regions. Alternatively, the isolation layer may be formed while the fin lines keep continuously extending. In subsequent processes, the fin lines are then separated to form a final layout of active regions. Here, the latter case will be described by way of example.

In order to suppress leakage between source and drain via subfin regions, a Punch-Through Stopper Layer (PTSL) may be formed in lower portions of the ridges underneath the fin lines. For example, for an n-type device to be formed on the p-well, a p-type PTSL (p-PTSL) may be formed; and for a p-type device to be formed on the n-well, an n-type PTSL may be formed (n-PTSL). The p-PTSL may have a p-type doping concentration higher than that in the p-well, and the n-PTSL may have an n-type doping concentration higher than that in the n-well.

There are various ways to form the fin lines as well as various well and PTSL configurations, which will not be described in detail here.

Figure 4A:
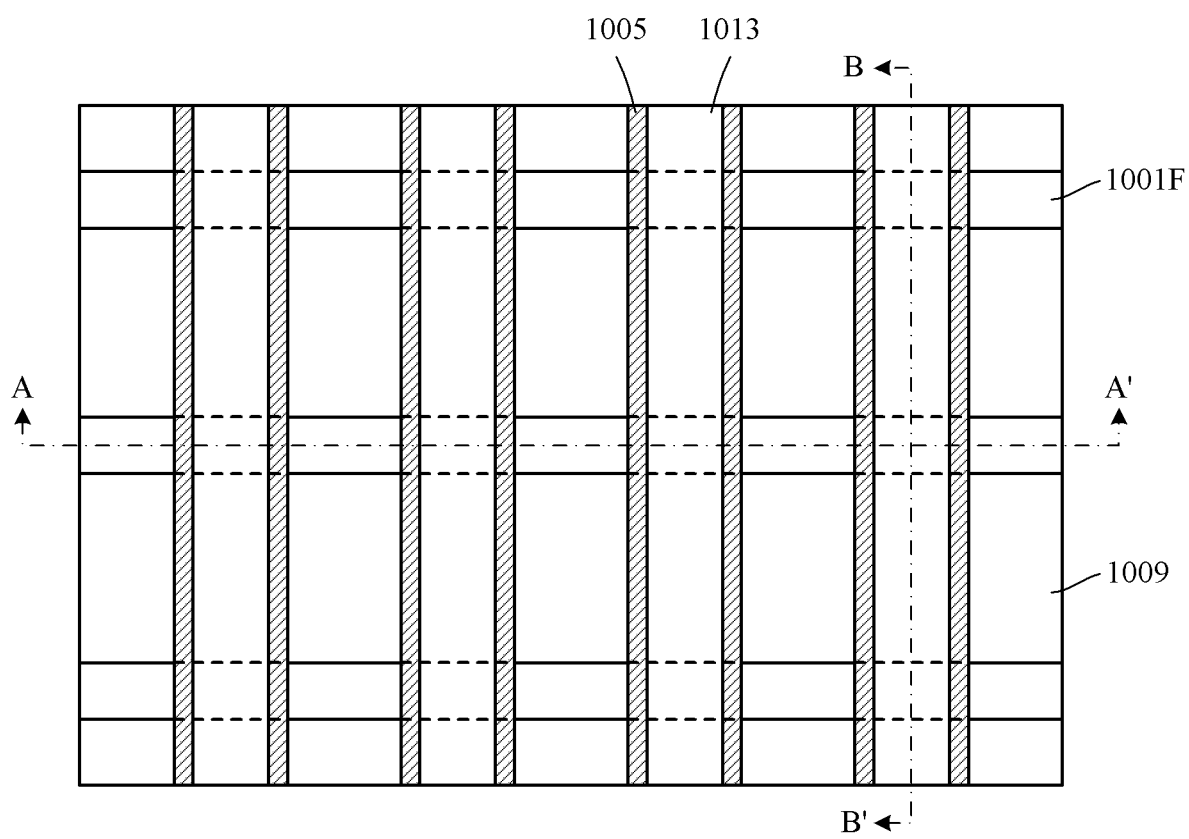
Figure 4B:
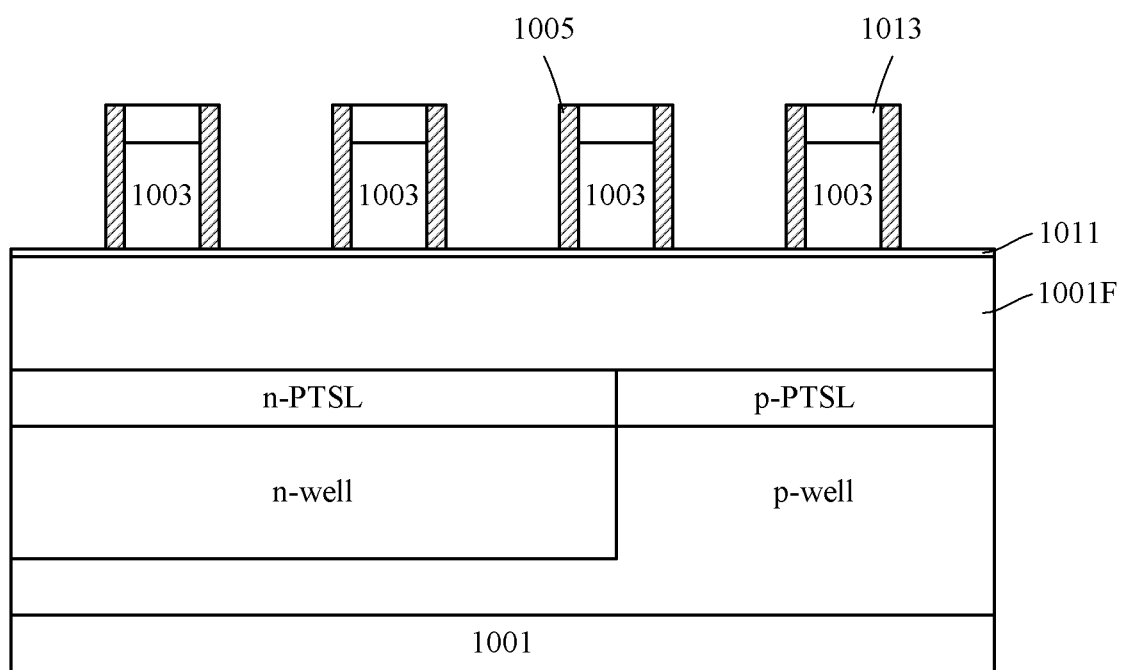
Figure 4C:
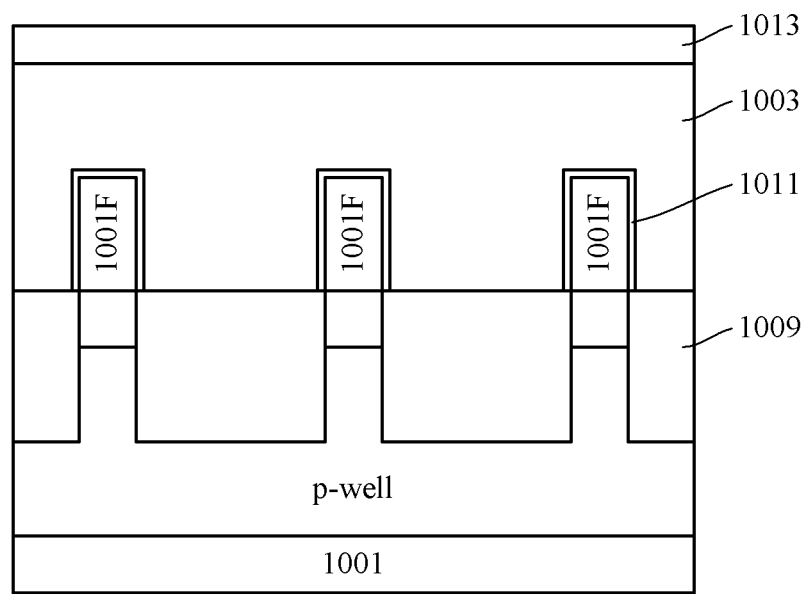

Next, as shown in FIGS. 4(a), 4(b) and 4(c) (FIG. 4(a) is a top view, FIG. 4(b) is a cross-sectional view taken along line AA' in FIG. 4(a), and FIG. 4 (c) is a cross-sectional view taken along line BB' in FIG. 4(a)), sacrificial gate lines 1003 may be formed on the substrate 1001 (more specifically, on the isolation layer 1009) to extend in a second direction (for example, a vertical direction in FIG. 4(a), or a direction perpendicular to the sheet in FIG. 4(b), or a horizontal direction in FIG. 4(c)) crossing (for example, substantially perpendicular to) the first direction and thus intersect the respective fin lines 1001F.

In order to better control the following process of etching the sacrificial gate lines 1003, an etching stopper layer 1011 may be formed firstly. For example, the etching stopper layer 1011 of oxide, with a thickness of about 1-5 nm, may be formed by deposition or thermal oxidation. In FIGS. 4(b) and 4(c), illustrated is the etching stopper layer 1011 formed on surfaces of the fin lines 1001F by, for example, thermal oxidation; and in FIG. 4(a), for convenience, the etching stopper layer 1011 is not shown.

Then, a material for the sacrificial gate lines may be formed on the substrate 1001 by, for example, deposition. The material for the sacrificial gate lines includes, for example, polysilicon or amorphous silicon, with a thickness of about 150-300 nm. The formed material for the sacrificial gate lines may be planarized by, for example, Chemical Mechanical Polishing (CMP), so that its top surfaces is planarized, and portions of the material left above top surfaces of the fin lines 1001F may have a thickness of about 70-150 nm. Then, the material for the sacrificial gate lines may be patterned into a series of the sacrificial gate lines 1003 by, for example, photolithography. For example, the sacrificial gate lines 1003 may extend in parallel and may have the same or different pitch(es) therebetween and/or width(s).

In this example, the material for the sacrificial gate lines is etched (selectively with respect to the isolation layer 1009 and/or the etching stopper layer 1011 of oxide) by, for example, RIE using a hard mask layer 1013. The hard mask layer 1013 may include, for example, nitride (for example, silicon nitride), with a thickness of about 50-150 nm. The process of etching using the hard mask will not be described in detail here.

A spacer 1005 may be formed on sidewalls of each of the sacrificial gate lines 1003 by a spacer formation process. The spacers 1005 may each include, for example, nitride, with a thickness of about 3-10 nm. As described above, the spacers 1005 surround the respective sacrificial gate lines 1003 and thus are ring-shaped. In the top view of FIG. 4(a), upper and lower ends of the spacers 1005 are not shown.

Figure 5:
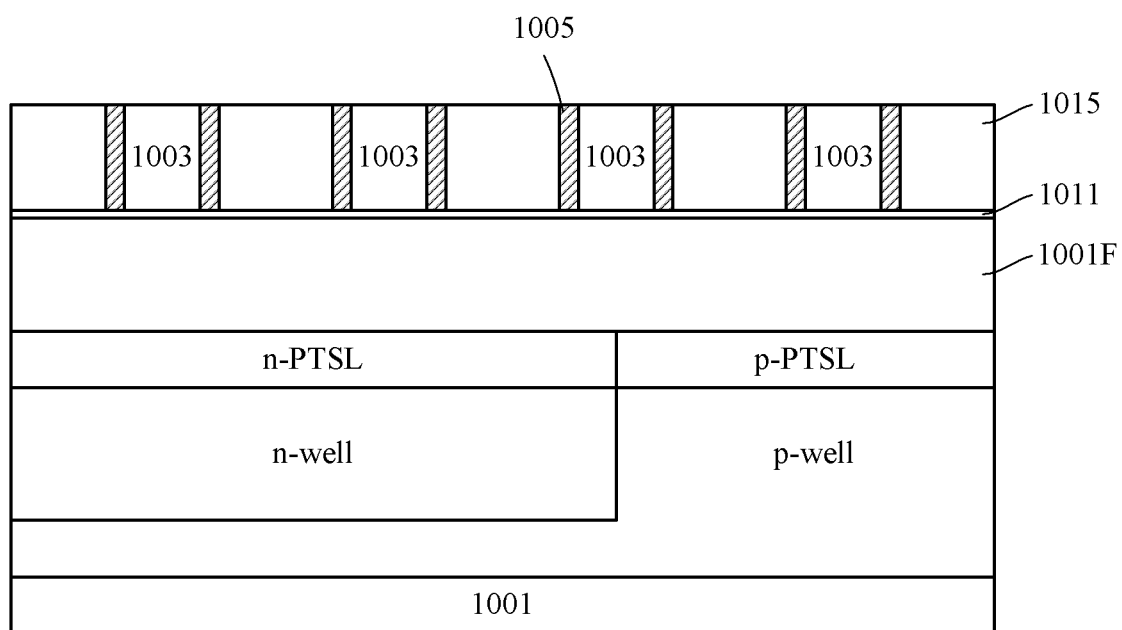

Next, first dielectric such as oxide may be filled in gaps between the respective sacrificial gate lines 1003 with the corresponding spacers 1005 formed on the sidewalls thereof to shield portions of the fin lines 1001F exposed by the respective sacrificial gate lines 1003 with the corresponding spacers 1005 formed on the sidewalls thereof. For example, oxide may be deposited on the structure shown in FIGS. 4(a), 4(b), and 4(c) and then planarized by, for example, CMP. The CMP may stop at the sacrificial gate lines 1003, thereby exposing the sacrificial gate lines 1003. Thus, a structure shown in FIG. 5 is obtained (FIG. 5 illustrates the cross section along line AA'). The first dielectric 1015 thus filled may also contribute to maintain stress or prevent stress release in subsequent processes.

After the continuous spacers 1005 are formed, active regions may be defined, that is, the fin lines 1001F are separated according to the layout design. According to an embodiment of the present disclosure, in separating the fin lines 1001F, ends of fins obtained by separating the fin lines 1001F may be defined by the spacers 1005.

Figure 6A:
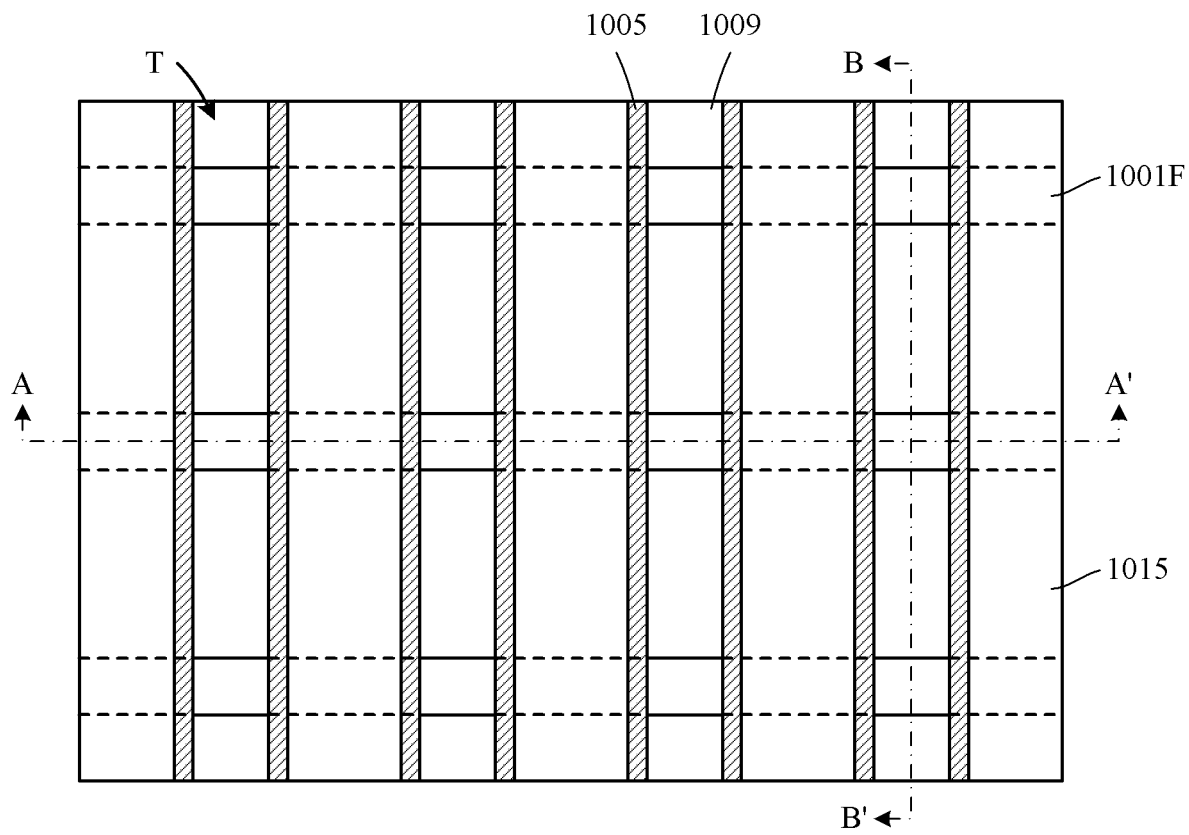
Figure 6B:
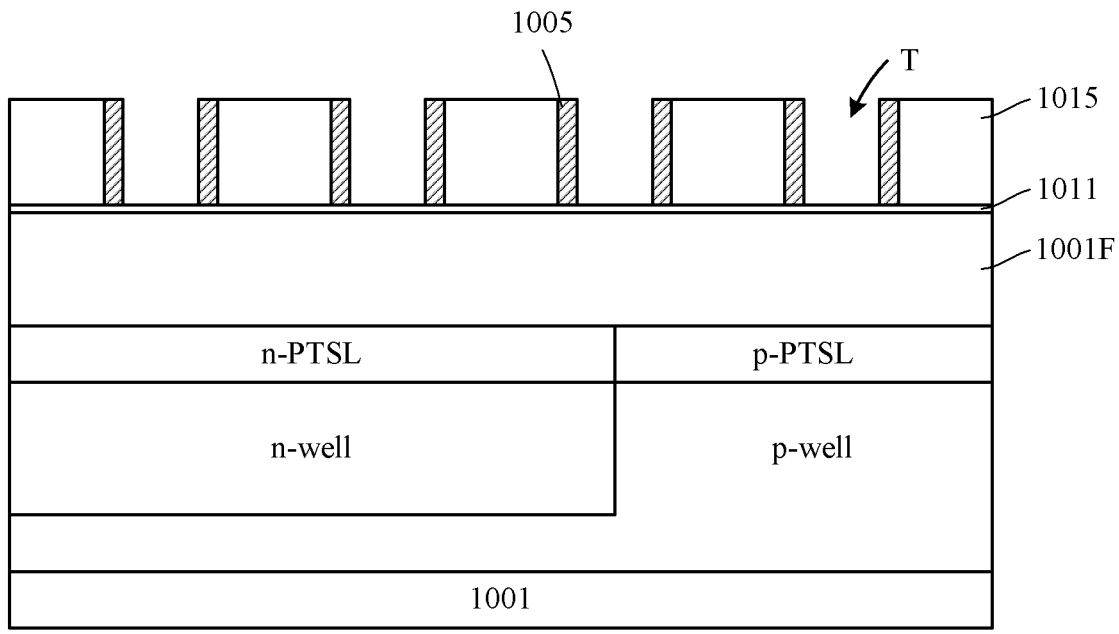

To this end, as shown in FIGS. 6(a) and 6(b) (FIG. 6(a) is a top view, and FIG. 6(b) is a cross-sectional view taken along line AA' in FIG. 6(a)), the sacrificial gate lines 1003 may be removed by selective etching, for example, wet etching or vapor phase etching, (with respect to the isolation layer 1009, the etching stopper layer 1011 and the first dielectric 1015 of oxide, and the spacers 1005 of nitride), thereby forming trenches T within the respective spacers 1005. Here, the etching is preferably isotropic etching to well expose inner walls of the spacers 1005. Portions of the fin lines 1001F are exposed by the trenches T (but are actually covered by the etching stopper layer 1011).

Some of the exposed portions of the fin lines 1001F may be separated according to the layout design to form separate active regions or fins. For example, this may be done by shielding fin lines which do not need to be separated by photoresist and exposing fin lines which need to be separated, and then performing selective etching.

Figure 7A:
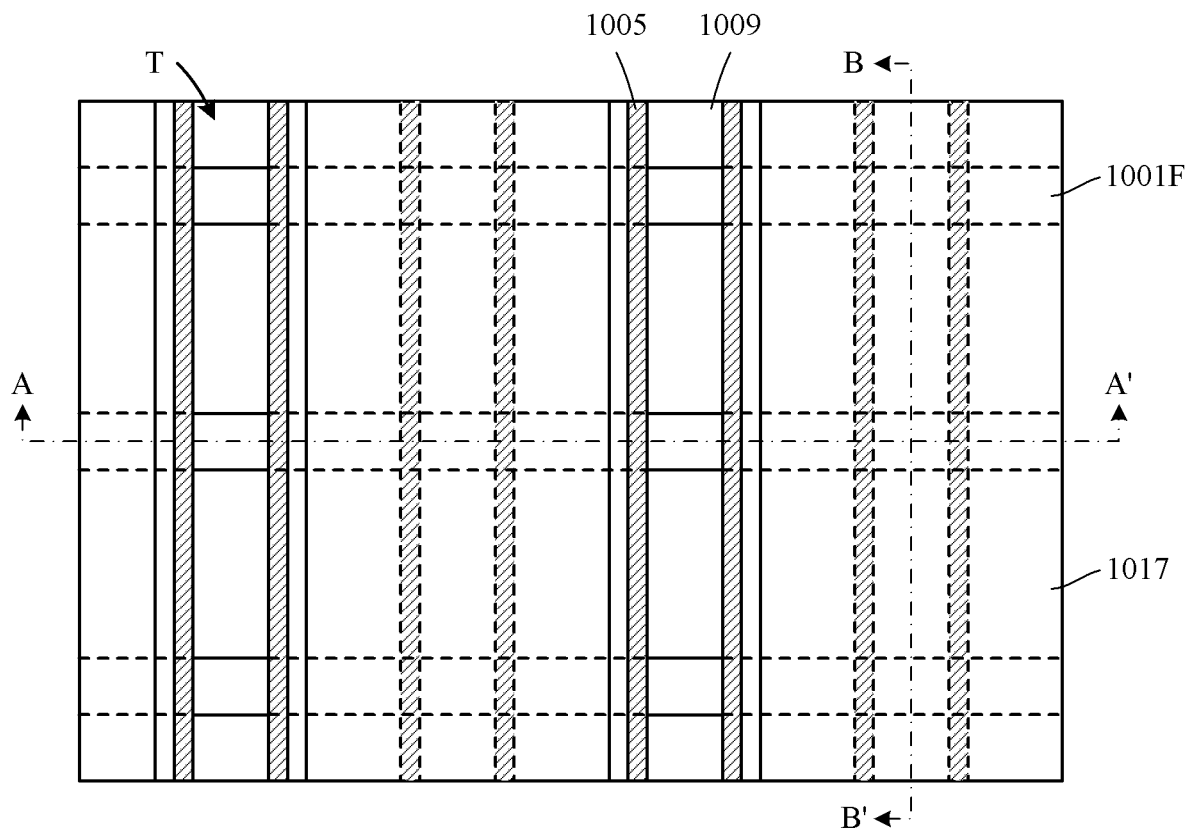
Figure 7B:
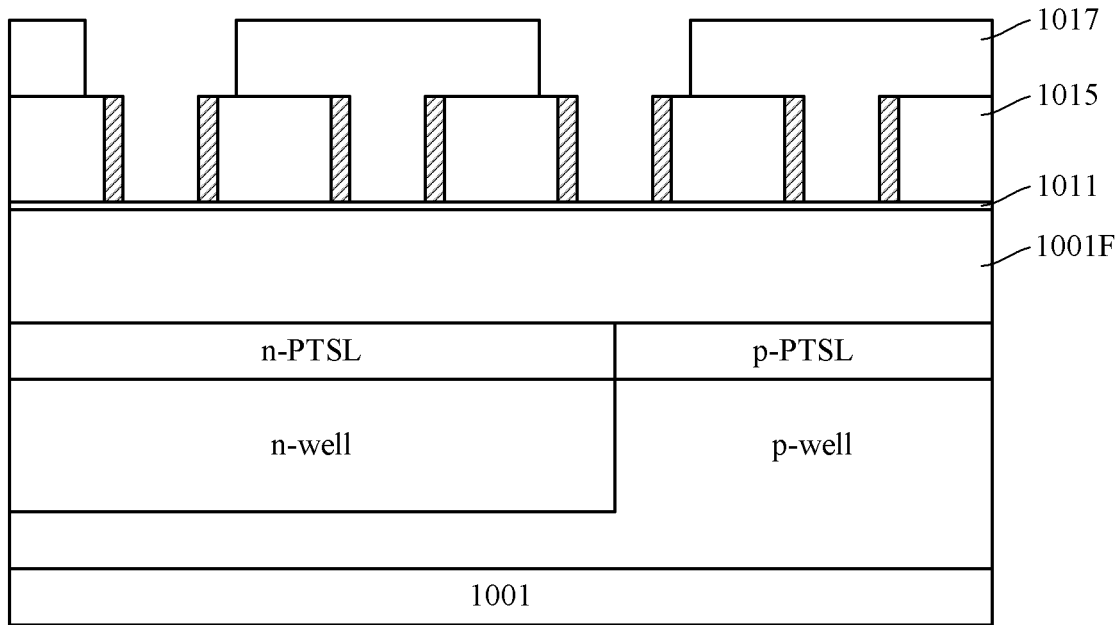

For example, as shown in FIGS. 7(a) and 7(b) (FIG. 7(a) is a top view, and FIG. 7(b) is a cross-sectional view taken along line AA' in FIG. 7(a)), photoresist 1017 may be formed on the structure shown in FIGS. 6(a) and 6(b), and then patterned (by, for example, exposure and development) to expose trenches T corresponding to the first and third sacrificial gate lines numbered from left to right and to shield trenches T corresponding to the second and fourth sacrificial gate lines numbered from left to right. Although it is shown here that the entire trench T corresponding to each of the first and third sacrificial gate lines is exposed and the entire trench T corresponding to each of the second and fourth sacrificial gate lines is shielded, the present disclosure is not limited thereto. For example, a portion of the trench T may be shielded while another portion of the trench T may be exposed. It is to be noted that which one of the trenches T or which portion thereof needs to be exposed is determined according to the layout design.

Figure 8:
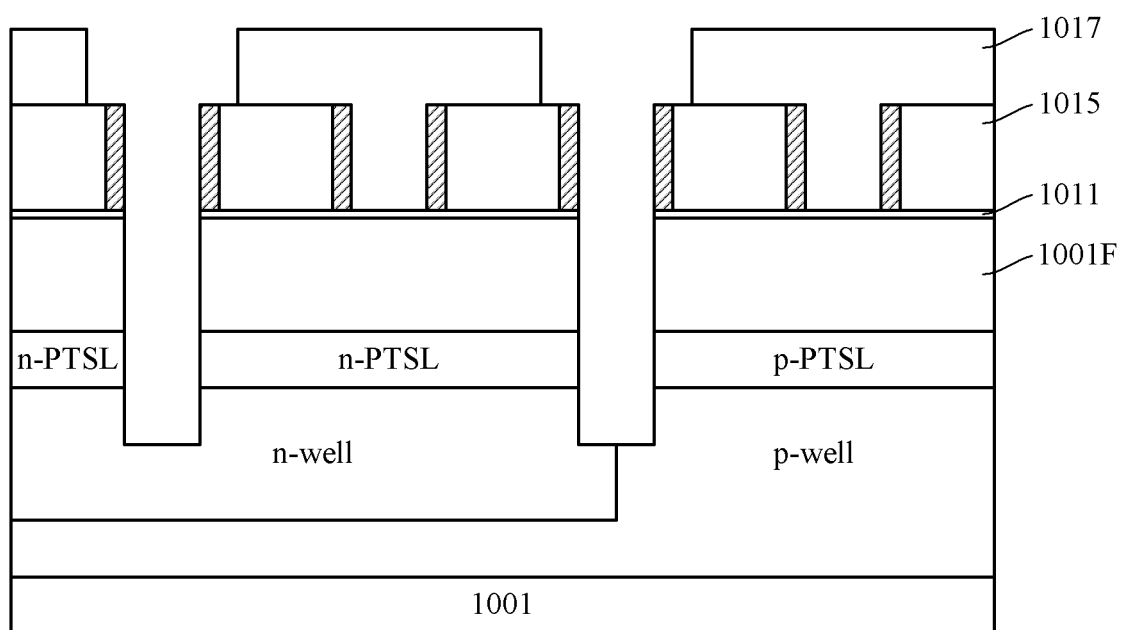

Then, as shown in FIG. 8 (FIG. 8 illustrates the cross section along line AA'), the fin lines 1001F may be separated via the trenches T. For example, the etching stopper layer 1011 and the ridges 1001F may be selectively etched in sequence by Reactive Ion Etching (RIE). The etching of the ridges 1001F may cut off the fin lines (i.e., the portions of the ridges above the top surface of the isolation layer 1009). Thus, the fin lines 1001F are separated into different portions, which may then constitute the fins of the devices. Hereinafter, the fins are still indicated by "1001F". Preferably, the etching of the ridges 1001F may pass through the PTSL and stop in the n-well or p-well. This contributes to ensure electrical isolation between the respective fins which have been separated. After that, the photoresist 1017 may be removed.

Since the spacers 1005 function like a mask in separating the fin lines 1001F, ends of the separated fins are self-aligned to the inner walls of the spacers 1005. This contributes to save the area on the substrate and thus reduce the manufacturing cost.

Figure 9A:
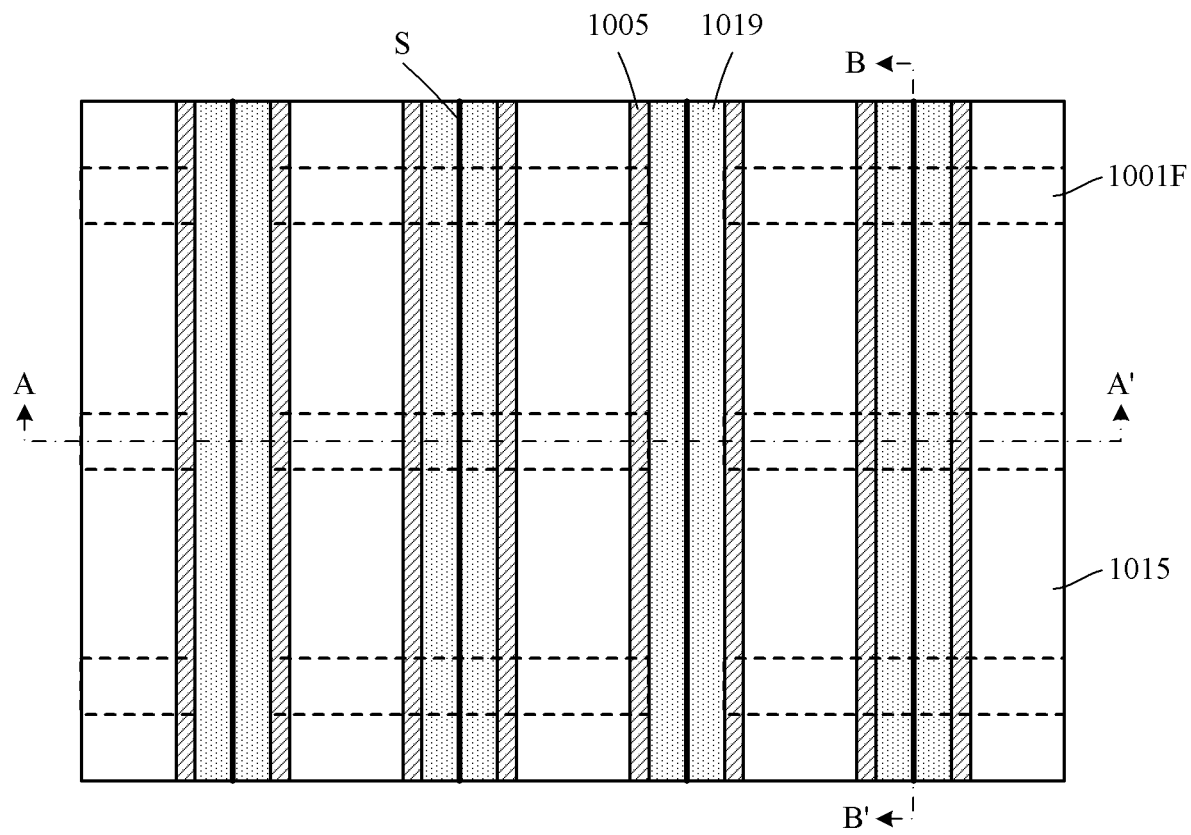
Figure 9B:
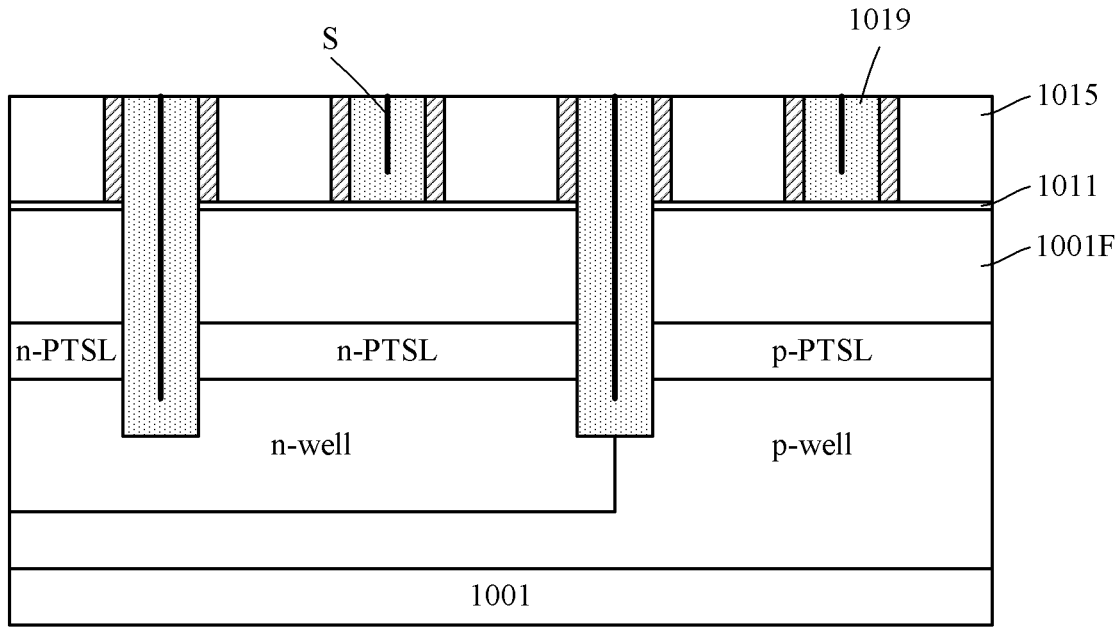

Next, as shown in FIGS. 9(a) and 9(b) (FIG. 9(a) is a top view, and FIG. 9(b) is a cross-sectional view taken along line AA' in FIG. 9(a)), second dielectric 1019 may be filled in spaces within the spacers 1005, in particular between opposite ends of the separated fins 1001F. For example, oxynitride (for example, silicon oxynitride) may be deposited on the structure shown in FIG. 8 and then planarized by, for example, CMP. The CMP may stop at the first dielectric 1015. The second dielectric 1019 is surrounded by the spacers 1005 to constitute dummy gates.

Here, the dummy gates are formed by filling the trenches with the second dielectric. In filling the trench, the second dielectric may be deposited firstly on side and bottom walls of the trench to form a U-shaped structure, with two opposite inner sidewalls thereof gradually getting closer as the deposition progresses. Since the trenches have small openings, the opposite inner sidewalls of each of the final U-shaped structures may not completely merge with each other, but have a certain gap or seam therebetween, as indicated by S. That is, in each of the final dummy gates, there may be such a gap or seam which makes the dummy gate still have a U-shaped structure. This structure can be seen in a Transmission Electron Microscopy (TEM) photograph. The seam S is not always shown in the following figures, for convenience of illustration.

Since opposite ends of the fins have the dummy gates of the dielectric interposed therebetween, stress relaxation may be reduced during subsequent source/drain epitaxy. In addition, a stressed dielectric material may be used for the dummy gates to create stress in the fins, thereby enhancing performances of the devices. For example, for a p-type device, the dummy gates may be compressive stressed; for an n-type device, the dummy gates may be tensile stressed.

After that, true gate stacks may be formed in the spaces within the spacers 1005 where desired according to the layout design. For example, this may be done by removing some portions of the second dielectric 1019 to expose the underlying fins 1001F and forming gate stacks in spaces left by the removal of the portions of the second dielectric 1019. The formed gate stacks intersect the underlying fins 1001F to define FinFETs.

In this example, for the CMOS process, different gate stacks may be formed respectively for n-type devices and p-type devices. To this end, processing may be performed on an n-type device region and a p-type device region, respectively. Hereinafter, an example in which the p-type device region is processed before the n-type device is processed will be described. However, the present disclosure is not limited thereto, and the processes may be exchanged in order.

Figure 10A:
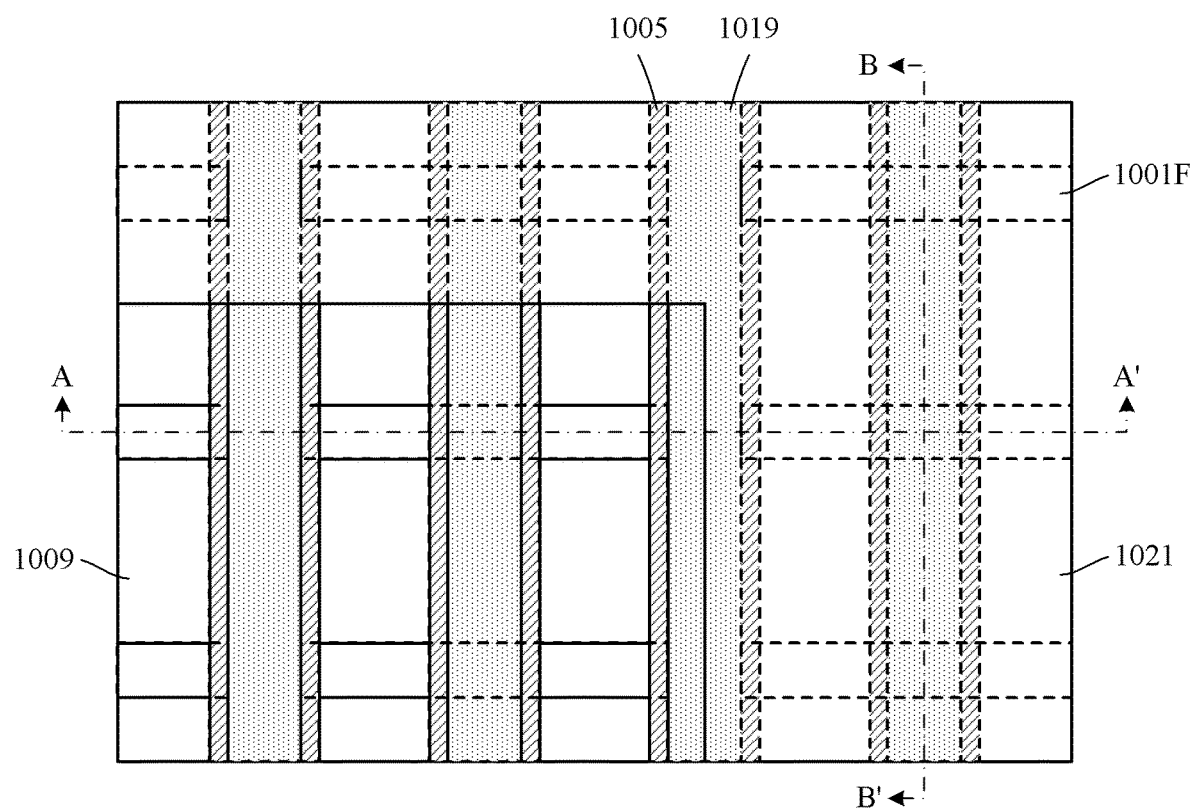
Figure 10B:
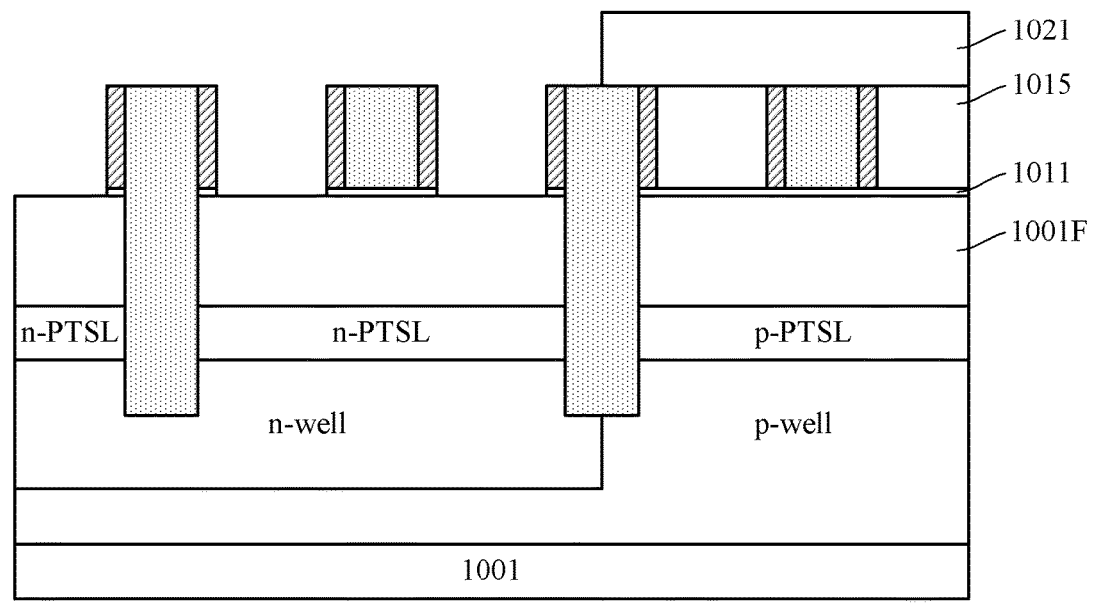
Figure 11A:
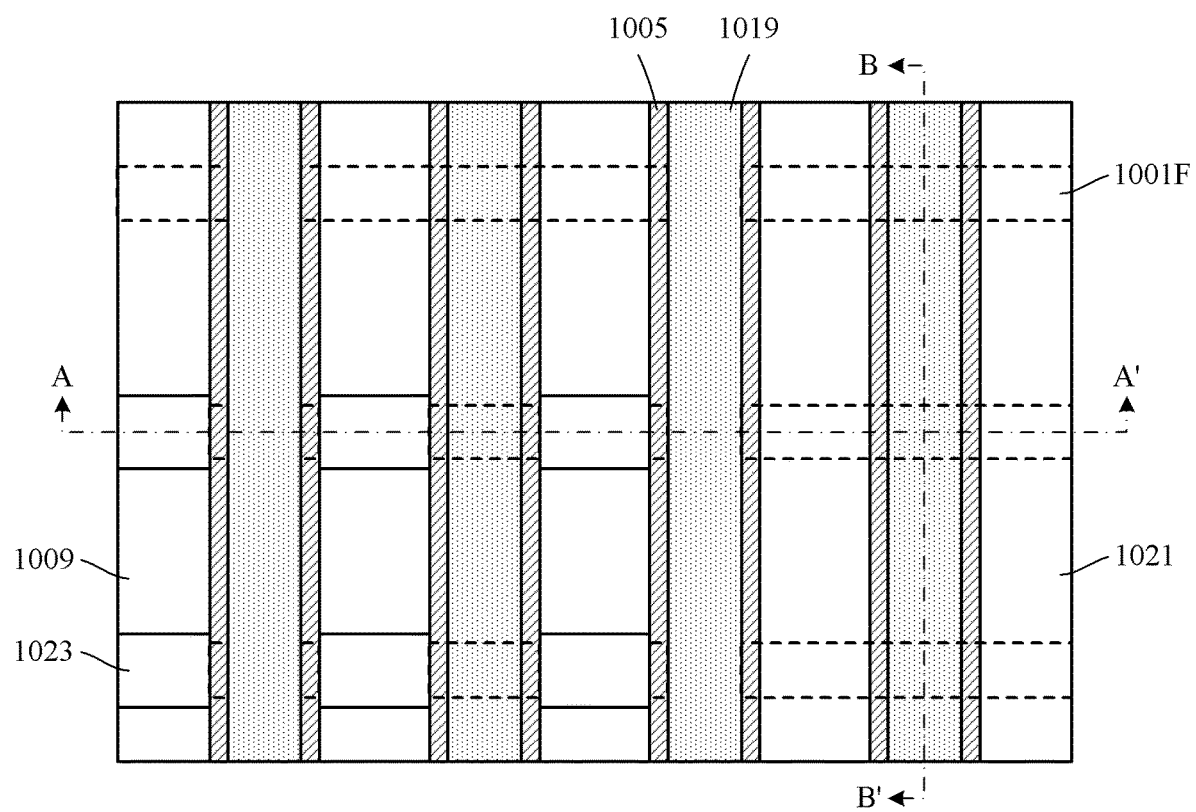
Figure 11B:
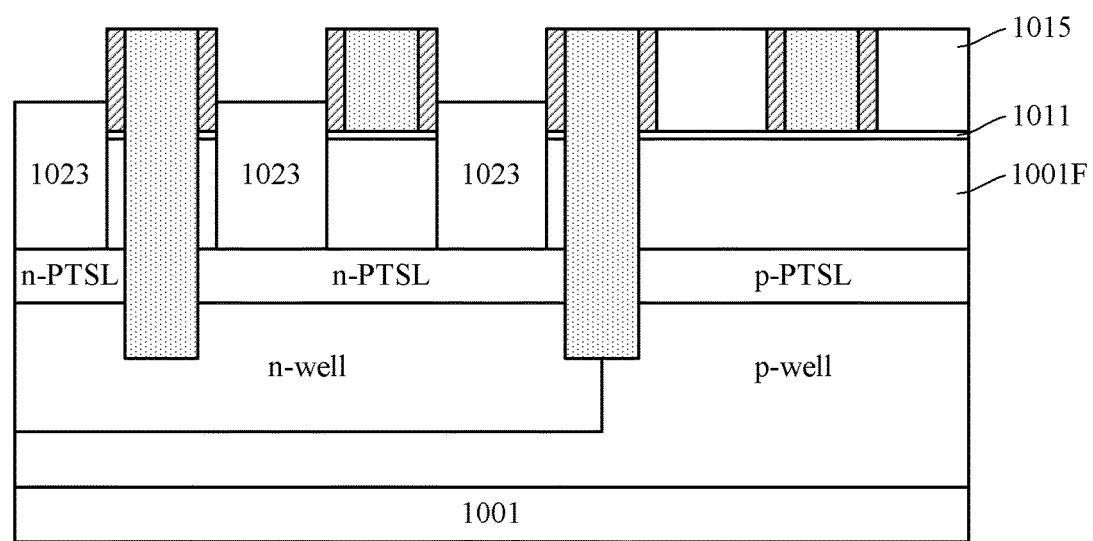

For example, as shown in FIGS. 10(a) and 10(b) (FIG. 10(a) is a top view, and FIG. 10(b) is a cross-sectional view taken along line AA' in FIG. 10(a)), photoresist 1021 may be formed on the structure shown in FIGS. 9(a) and 9(b), and then patterned to shield the n-type device region (for example, the upper left portion and the right portion in FIG. 10(a)) while exposing the p-type device region (for example, the lower left portion in FIG. 10 (a)).

At this time, for example, the second dielectric 1019 within the spacers 1005 may be removed by selectively etching the second dielectric 1019, and gate stacks may be formed in spaces left within the spacers 1005 by the removal of the second dielectric 1019 to manufacture the FinFETs.

According to an embodiment of the present disclosure, the strained source/drain technique may also be adopted here.

For example, the first dielectric 1015 and the etching stopper layer 1011 of oxide may be selectively etched by, for example, RIE, with the photoresist 1021 shown in FIGS. 10(*a*) and 10(*b*) as a mask to expose the underlying fins 1001F. Thus, portions (corresponding to source/drain regions) of the fins 1001F extending between adjacent ones of the spacers 1005 in the p-type device region are exposed. After that, the photoresist 1021 may be removed.

Next, as shown in FIGS. 11(*a*) and 11(*b*) (FIG. 11(*a*) is a top view, and FIG. 11(*b*) is a cross-sectional view taken along line AA' in FIG. 11(*a*)), the fins 1001F may be selectively etched by, for example, RIE to remove at least a portion thereof so that the fins 1001F are recessed. For example, the fins 1001F may be recessed to the n-PTSL, that is, portions of the fins 1001F above the n-PTSL are removed. Then, a further semiconductor material 1023 serving as the source/drain regions may be epitaxially grown with the remaining portions of the fins 1001F as a seed. For example, for the p-type devices, the source/drain regions 1023 may include SiGe (wherein Ge has an atom percentage of about 30-75%) to apply compressive stress to the fins 1001F of Si serving as channel regions, thereby improving performances of the devices. In addition, the semiconductor material 1023 may be doped in situ while being grown by, for example, p-type doping, with a doping concentration of about 1E19-1E21 cm$^{-3}$. The grown semiconductor material 1023 may have a top surface at a level, on one hand, higher than that of the top surfaces of the fins 1001F so that stress is better applied to the fins 1001F; and on the other hand, lower than that of the top surfaces of the spacers 1005 or the dummy gates 1019 so that a stress retention layer may subsequently be formed thereon.

In growing the semiconductor material 1023, there are seed layers on opposite sides (left and right sides in FIGS. 11(*a*) and 11(*b*)) and the bottom thereof, and thus high growth quality is possible. The semiconductor material 1023 grown in this way may constitute ridges like the fins 1001F.

In addition, as shown in FIG. 11(*b*), due to the presence of the first dielectric 1015 on the n-type device region and the dummy gates 1019 between the p-type device region and the n-type device region, it is possible to prevent the stress in the grown semiconductor material 1023 from being released into the n-type device region and contribute to improve performances of the p-type devices.

Figure 12:
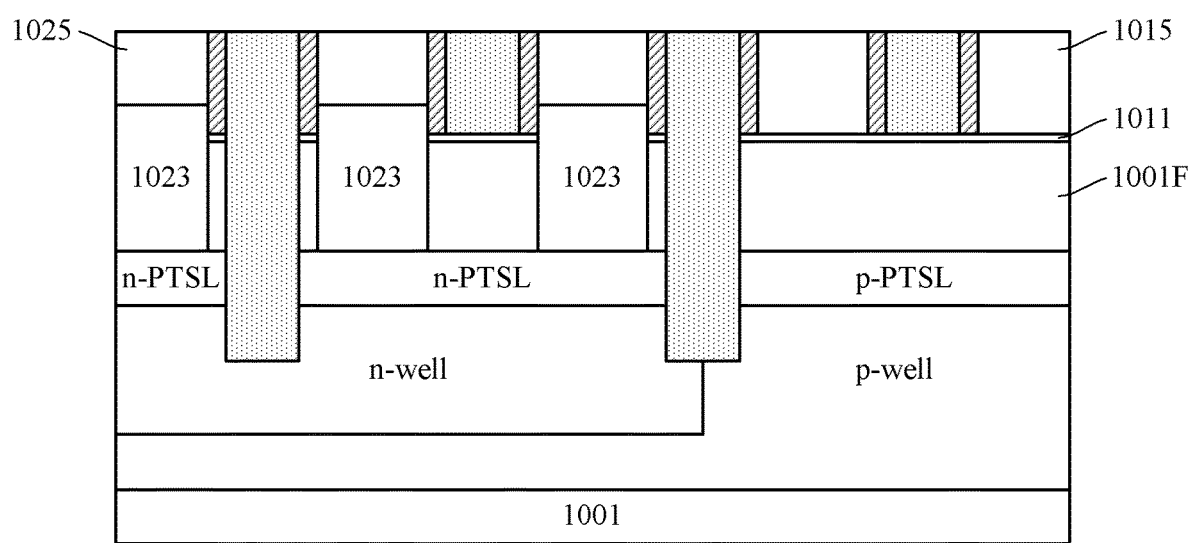

Then, as shown in FIG. 12 (FIG. 12 illustrates the cross section along line AA'), third dielectric 1025 of, for example, oxide, may be formed on the structure shown in FIGS. 11(*a*) and 11(*b*) by, for example, deposition, and then planarized by, for example, CMP. The CMP may stop at the spacers 1005. Thus, the formed third dielectric 1025 is filled in the spaces between adjacent ones of the spacers and contributes to prevent stress in the underlying semiconductor material 1023 from being released.

Next, the n-type device region may be processed similarly.

Figure 13A:
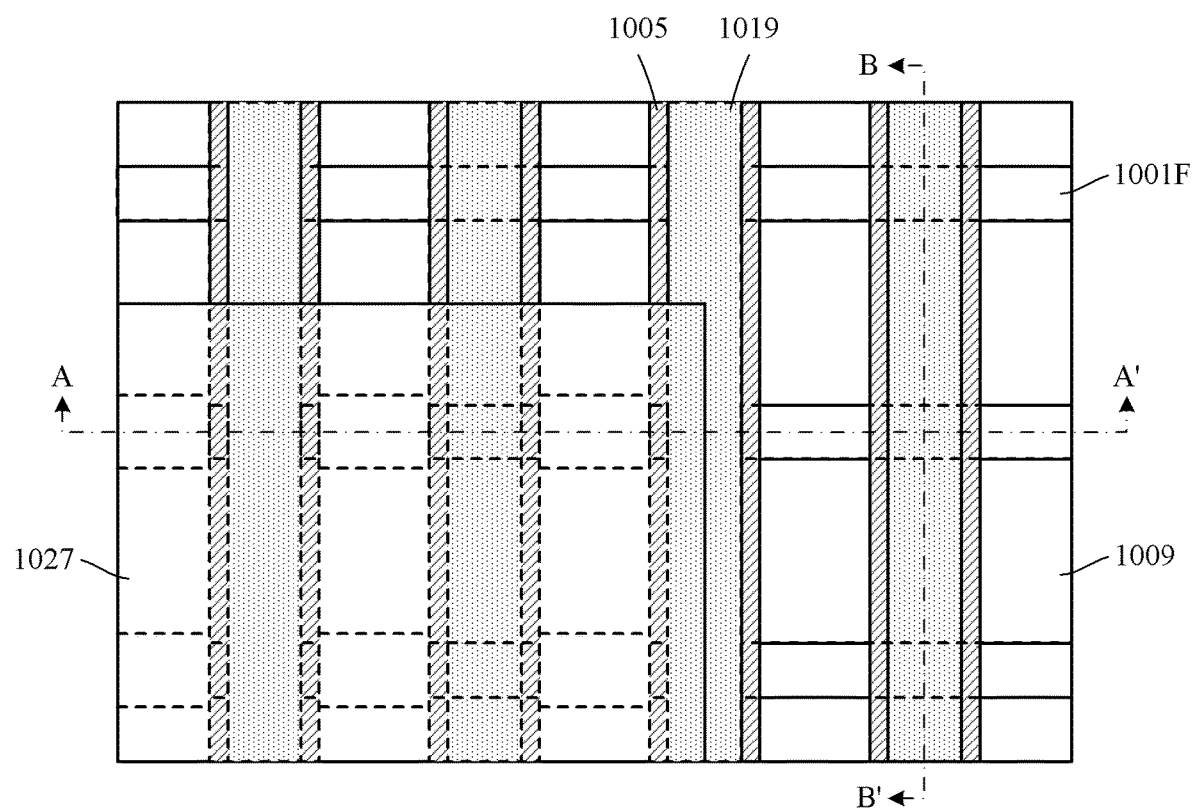
Figure 13B:
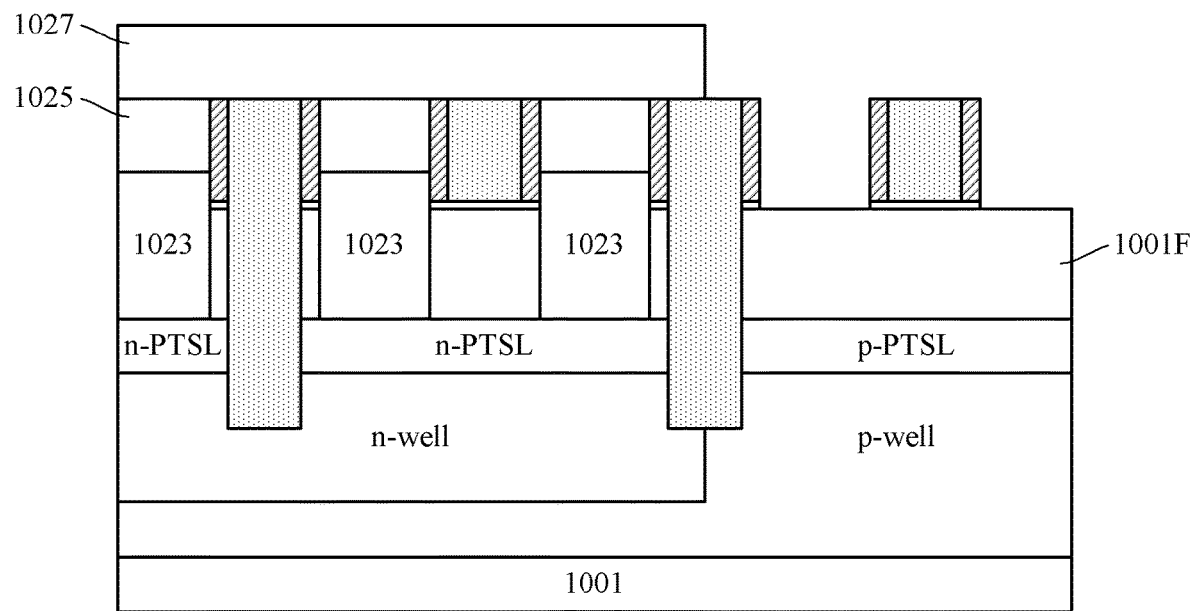

To this end, as shown in FIGS. 13(*a*) and 13(*b*) (FIG. 13(*a*) is a top view, and FIG. 13(*b*) is a cross-sectional view taken along line AA' in FIG. 13(*a*)), photoresist 1027 may be formed on the structure shown in FIG. 12 and then patterned to shield the p-type device region (for example, the lower left portion in FIG. 13(*a*)) while exposing the n-type device region (for example, the upper left portion and the right portion in FIG. 13(*a*)).

At this time, for example, the second dielectric 1019 within the spacers 1005 may be removed by selectively etching the second dielectric 1019, and gate stacks may be formed in spaces left within the spacers 1005 by the removal of the second dielectric 1019 to manufacture the FinFETs.

Certainly, the strained source/drain technique may also be applied to the n-type device region.

For example, the first dielectric 1015 and the etching stopper layer 1011 of oxide may be selectively etched by, for example, RIE, with the photoresist 1027 shown in FIGS. 13(*a*) and 13(*b*) as a mask to expose the underlying fins 1001F. Thus, portions (corresponding to the source/drain regions) of the fins 1001F extending between adjacent ones of the spacers 1005 in the n-type device region are exposed. After that, the photoresist 1027 may be removed.

Figure 14:
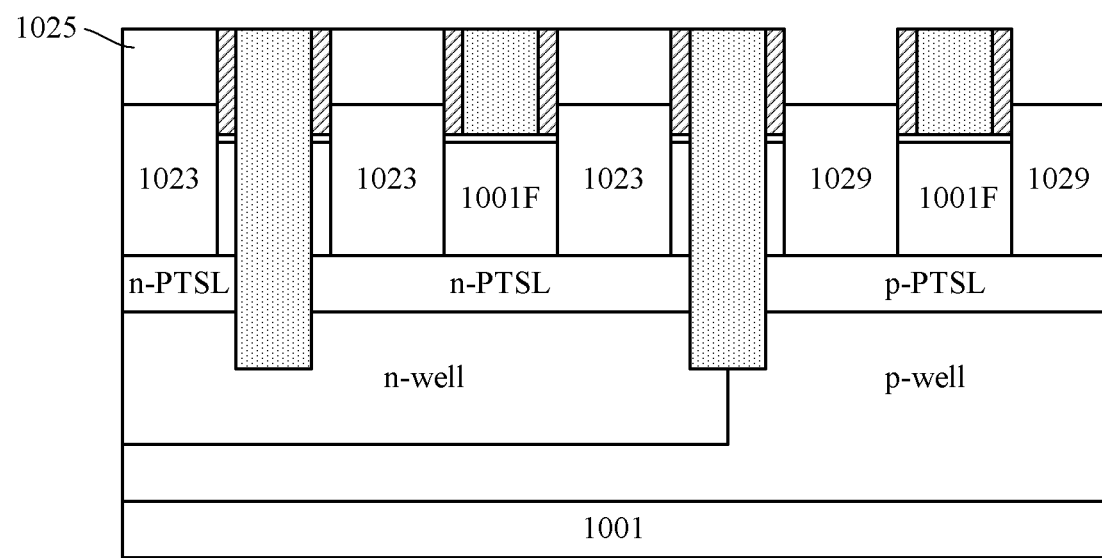

Next, as shown in FIG. 14 (FIG. 14 illustrates the cross section along line AA'), the fins 1001F may be selectively etched by, for example, RIE to remove at least a portion thereof so that the fins 1001F are recessed. For example, the fins 1001F may be recessed to the p-PTSL, that is, portions of the fins 1001F above the p-PTSL are removed. Upon the removal of the portions of the fins 1001F, stress in the semiconductor layer 1023 may be released. However, the third dielectric 1025 and the dummy gates 1019 between the p-type device region and the n-type device region contribute to reduce such release.

Then, a further semiconductor material 1029 serving as the source/drain regions may be epitaxially grown with the remaining portions of the fins 1001F as a seed. For example, for the n-type devices, the source/drain regions 1029 may include Si:C (wherein C has an atom percentage of about 0.1-3%) to apply tensile stress to the fins 1001F of Si serving as channel regions, thereby improving performances of the devices. In addition, the semiconductor material 1029 may be doped in situ while being grown by, for example, n-type doping, with a doping concentration of about 1E19-1E21 cm$^{-3}$. The grown semiconductor material 1029 may have a top surface at a level, on one hand, higher than that of the top surfaces of the fins 1001F so that stress is better applied to the fins 1001F; and on the other hand, lower than that of the top surfaces of the spacers 1005 or the dummy gates 1019 so that a stress retention layer may subsequently be formed thereon.

In growing the semiconductor material 1029, there are seed layers on opposite sides (left and right sides in FIG. 14) and the bottom thereof, and thus high growth quality is possible. The semiconductor material 1029 grown in this way may constitute ridges like the fins 1001F.

In addition, as shown in FIG. 14, due to the presence of the third dielectric 1025 on the p-type device region and the dummy gates between the p-type device region and the n-type device region, it is possible to prevent the stress in the grown semiconductor material 1029 from being released into the p-type device region and contributes to improve performances of the p-type devices.

Then, as shown in FIGS. 15(*a*) and 15(*b*) (FIG. 15(*a*) is a top view, and FIG. 15(*b*) is a cross-sectional view taken along line AA' in FIG. 15(*a*)), fourth dielectric 1031 of, for example, oxide (which may be the same as the third dielectric 1025) may be formed on the structure shown in FIG. 14 by, for example, deposition, and then planarized by, for example, CMP. The CMP may stop at the spacers 1005. Thus, the formed fourth dielectric 1031 is filled in the spaces between adjacent ones of the spacers and contributes to prevent stress in the underlying semiconductor material 1029 from being released.

Figure 27:
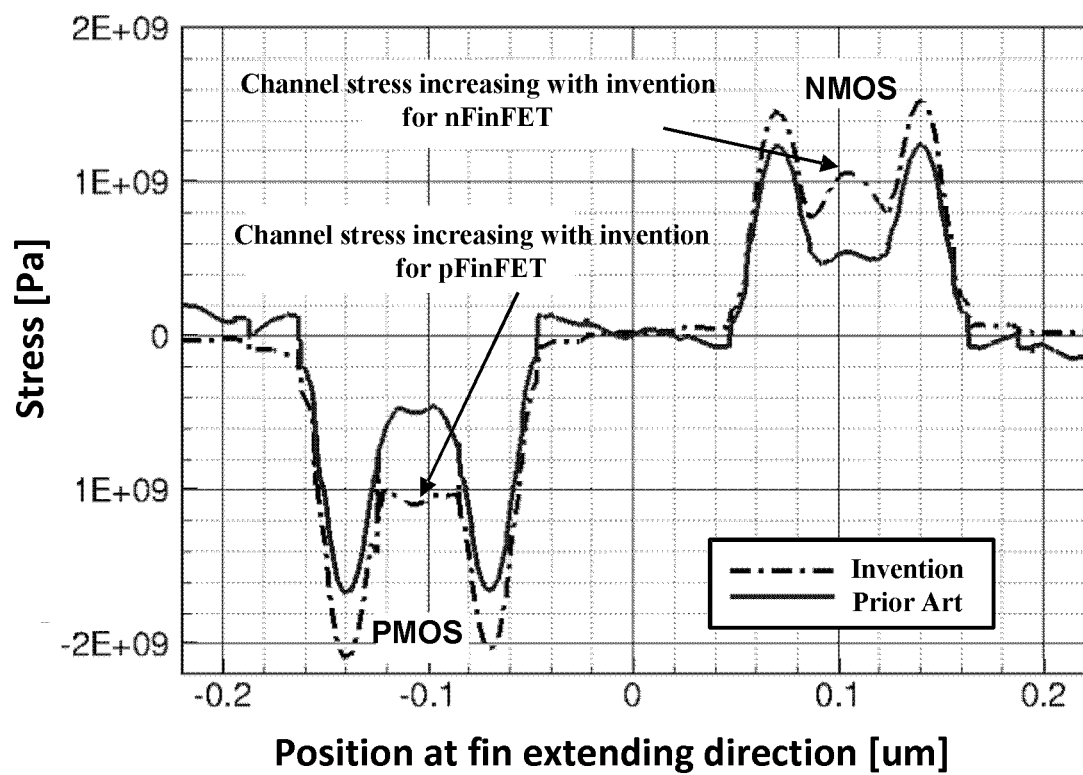
FIG. 27 illustrates stress enhancement which may be achieved by stress retention mechanisms according to an embodiment of the present disclosure.

It can be seen that the stress in the devices may be increased due to the various stress retention mechanisms. FIG. 27 illustrates stress enhancement which may be achieved by the stress retention mechanisms according to an embodiment of the present disclosure. As shown in FIG. 27, stress enhancement in the channel regions may be achieved for both the n-type device and the p-type device by using these stress retention mechanisms.

Figure 15A:
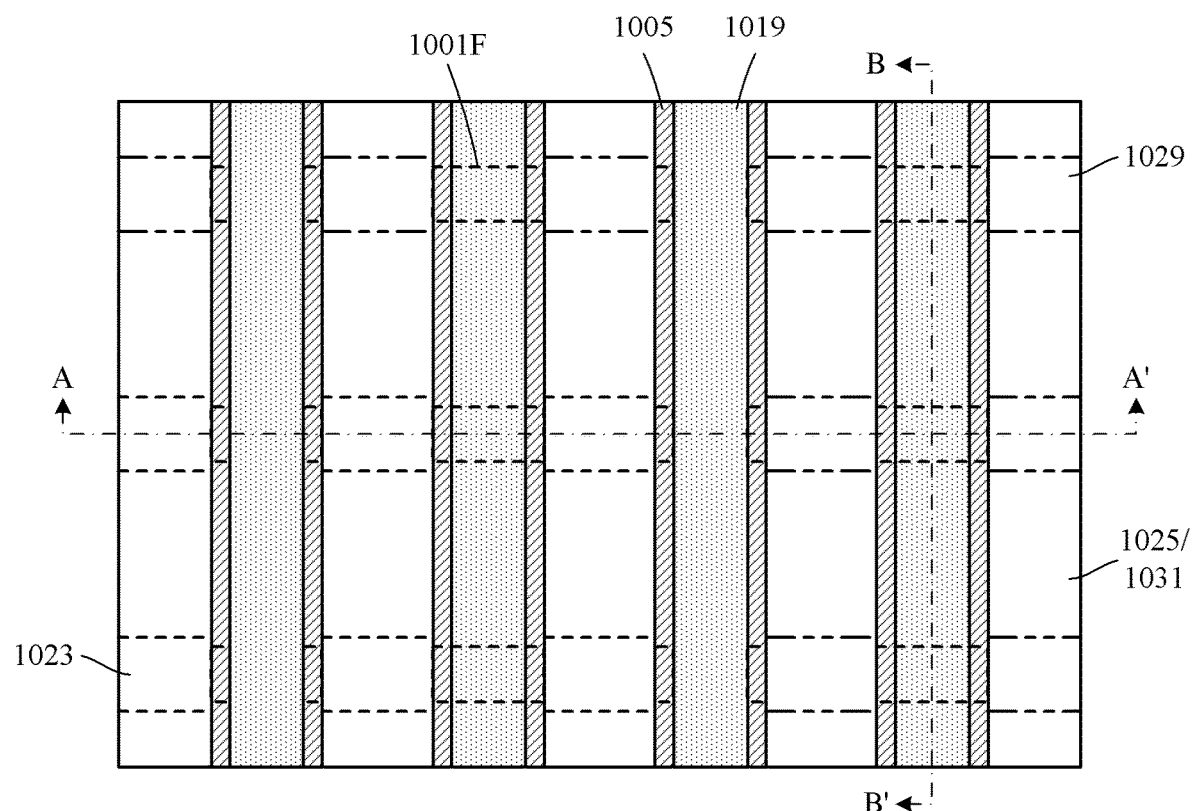
Figure 15B:
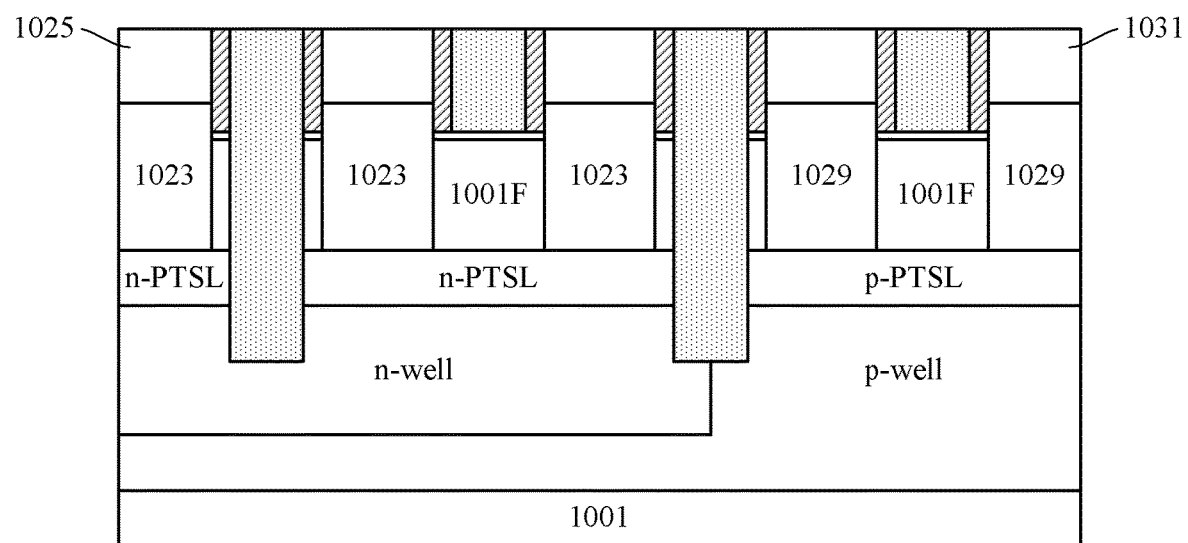

As shown in FIGS. 15(a) and 15(b), the active regions now are in such a form that the active regions generally still constitute ridges extending in the first direction, wherein portions of the ridges directly under the dummy gates 1019 and the spacers 1005 are from the original fins 1001F, and portions of the ridges extending between adjacent ones of the spacers 1005 constitute the strained source/drain regions 1023, 1029. The strained source/drain regions 1023, 1029 may be thicker than the original fins 1001F. In this example, the dummy gates 1019 may isolate different portions of the active regions from each other.

After the strained source/drain regions are formed, desired portions of the dummy gates 1019 may be replaced with true gate stacks. To this end, the portions of the dummy gates 1019 which need to be replaced may be removed and then replaced with the true gate stacks. The replacement of the gate stacks may be performed for the n-type devices and the p-type devices, respectively.

Figure 16A:
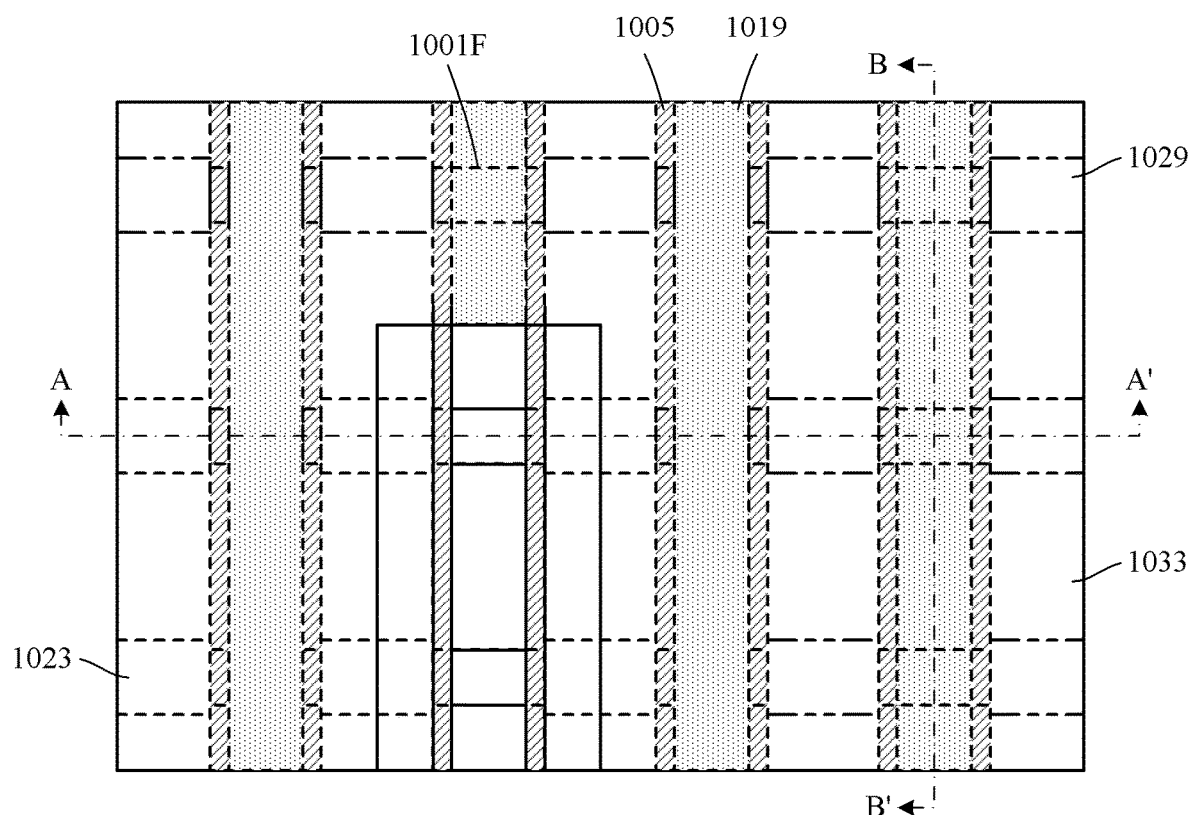
Figure 16B:
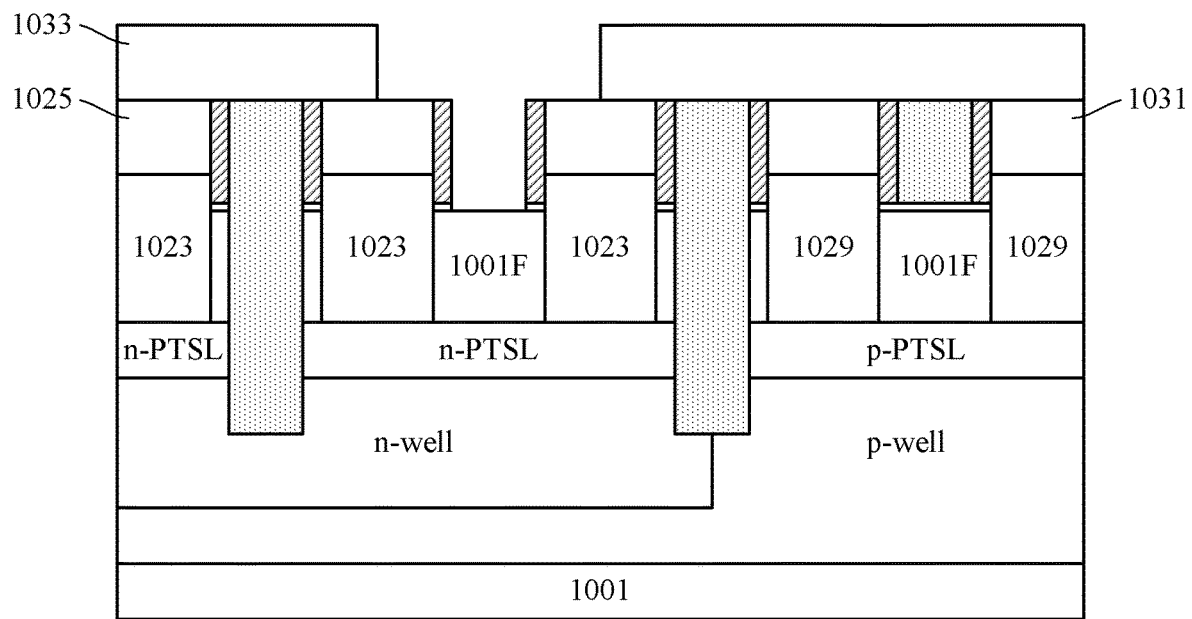

For example, as shown in FIGS. 16(a) and 16(b) (FIG. 16(a) is a top view, and FIG. 16(b) is a cross-sectional view taken along line AA' in FIG. 16(a)), photoresist 1033 may be formed on the structure shown in FIGS. 15(a) and 15(b), and then patterned to shield portions of the dummy gates which need to be left (the first, third, and fourth dummy gates and a portion of the second dummy gate, numbered from left to right in the figure) while exposing portions of the dummy gates which need to be replaced (portions for the p-type devices, here, a portion of the second dummy gate numbered from left to right in the figure). The dummy gates 1019 are selectively etched by, for example, RIE (with respect to the dielectric 1025/1031 of oxide and the spacers 1005 of nitride) with the photoresist 1033 as a mask. The etching may stop at the etching stopper layer 1011. Thus, since these portions of the dummy gates are removed, spaces are left within the spacers 1005 (to accommodate the gate stacks), and the fins 1001F are exposed by the spaces (but surfaces of the fins are still covered with the etching stopper layer 1011, which may be removed by, for example, cleaning or selective etching). After that, the photoresist 1033 may be removed.

Figure 17A:
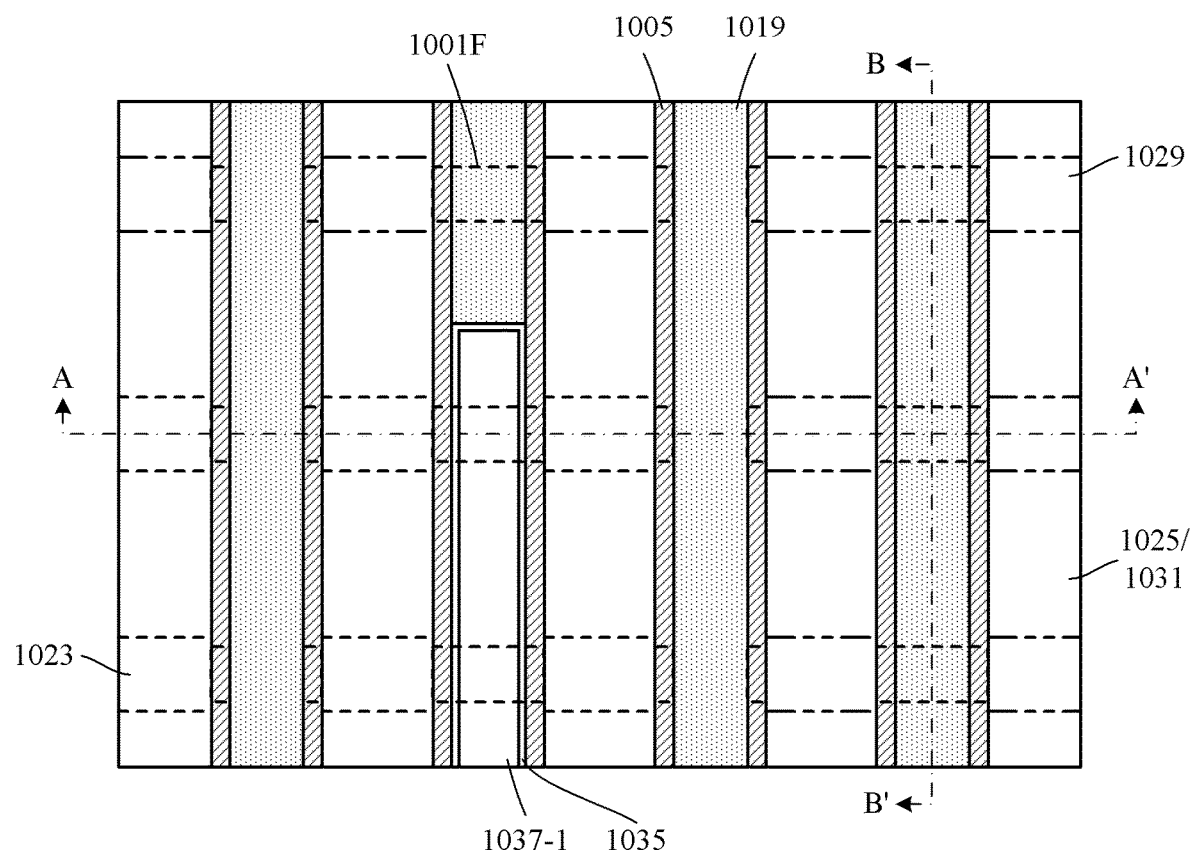
Figure 17B:
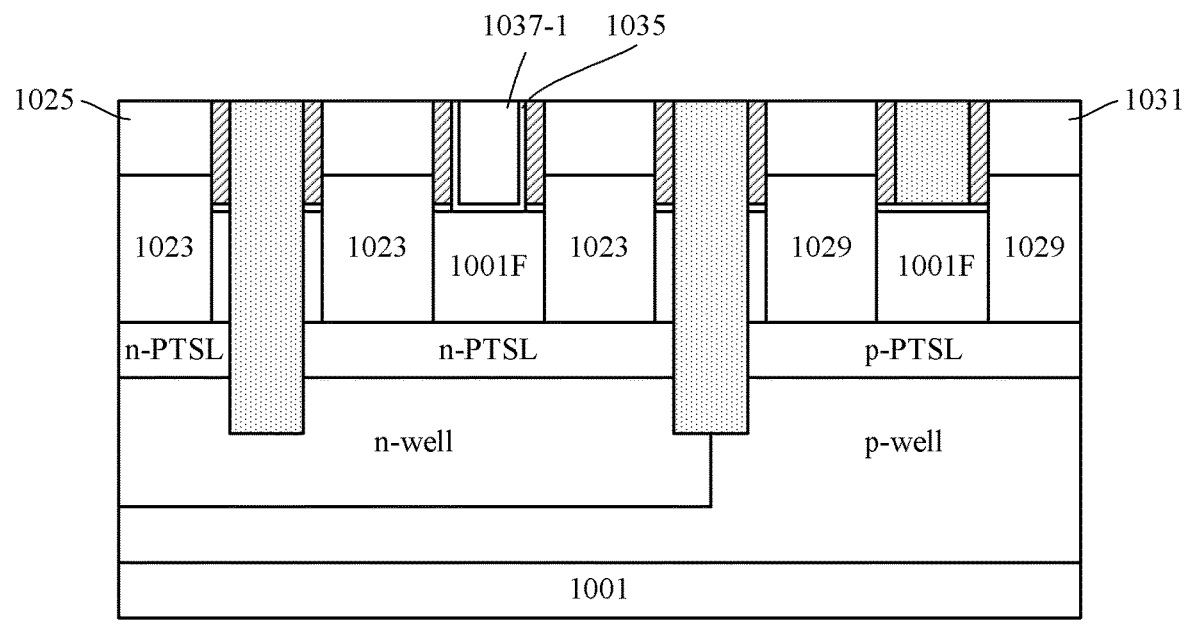

Then, as shown in FIGS. 17(a) and 17(b) (FIG. 17(a) is a top view, and FIG. 17(b) is a cross-sectional view taken along line AA' in FIG. 17(a)), gate stacks are formed in the spaces left within the spacers 1005. Here, gate stacks for the p-type devices may be formed.

For example, a gate dielectric layer 1035 may be formed in the spaces by deposition such as Atomic Layer Deposition (ALD). The gate dielectric layer 1035 may include high-k gate dielectric such as $HfO_2$ with a thickness of about 1-3 nm. Before the gate dielectric layer 1035 is formed, an interface layer (not shown) of oxide, with a thickness of about 0.3-1.2 nm, may be formed on the surfaces of the fins 1001F. After that, a gate electrode layer 1037-1, such as a metal gate electrode, for the p-type devices may be formed by deposition. The formed gate electrode layer 1037-1 and gate dielectric layer 1035 may be planarized by, for example, CMP. The CMP may stop at the dielectric 1025/1031. Thus, the gate electrode layer 1037-1 and the gate dielectric layer 1035 are left in the spacers 1005 to form gate stacks.

Next, the gate stacks may similarly be replaced for the n-type devices.

Figure 18A:
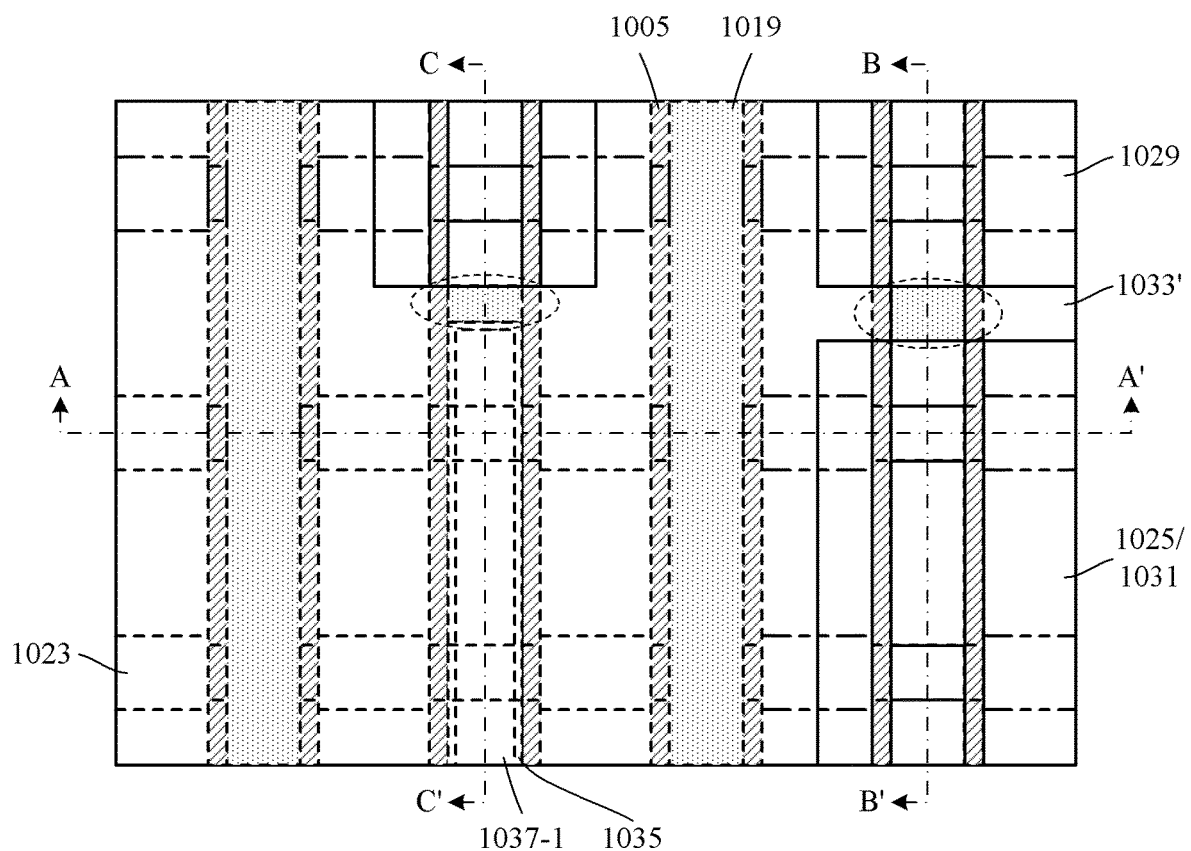
Figure 18B:
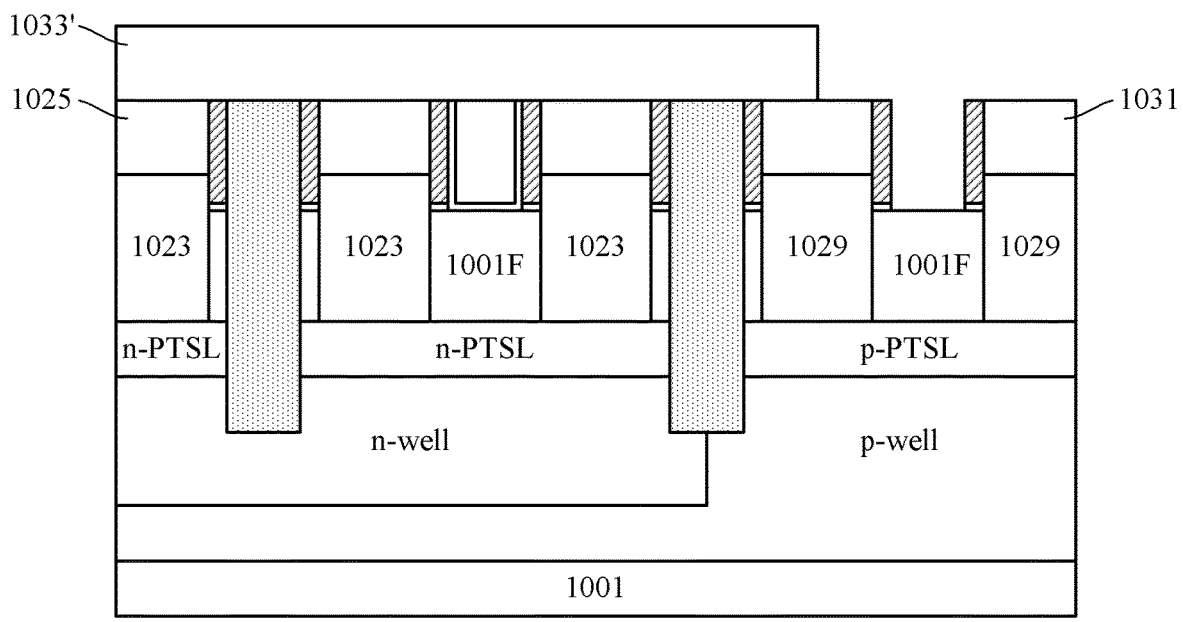
Figure 18C:
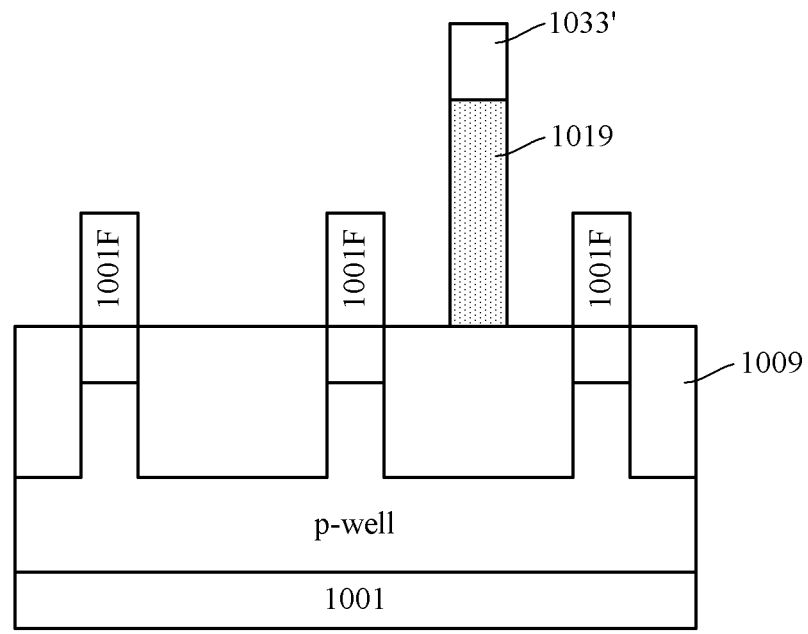
Figure 18D:
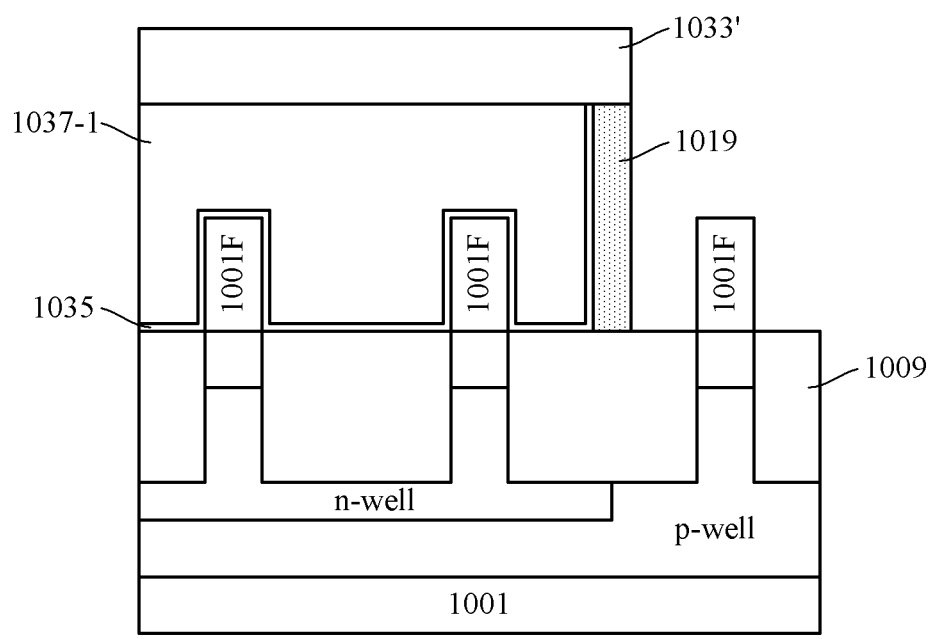

For example, as shown in FIGS. 18(a), 18(b), 18(c) and 18(d) (FIG. 18(a) is a top view, FIG. 18(b) is a cross-sectional view along line AA' in FIG. 18(a), FIG. 18(c) is a cross-sectional view taken along line BB' in FIG. 18(a), and FIG. 18(d) is a cross-sectional view taken along line CC' in FIG. 18(a)), photoresist 1033' may be formed on the structure shown in FIGS. 17(a) and 17(b), and then patterned to shield portions of the dummy gates which need to be left (the first and third dummy gates, a portion of the second dummy gate, and a portion of the fourth dummy gate, numbered from left to right in the figure), while exposing portions of the dummy gates which need to be replaced (portions for the n-type device, here, portions of the second dummy gate and the fourth dummy gate numbered from left to right in the figure). The dummy gates 1019 are selectively etched by, for example, RIE (with respect to the dielectric 1025/1031 of oxide and the spacers 1005 of nitride) with the photoresist 1033' as a mask. The etching may stop at the etching stopper layer 1011. Thus, since these portions of the dummy gates are removed, spaces are left within the spacers 1005 (to accommodate the gate stacks), and the fins 1001F are exposed by the spaces (but surfaces of the fins are still covered with the etching stopper layer 1011, which may be removed, for example, by cleaning or selective etching). After that, the photoresist 1033' may be removed.

According to an embodiment of the present disclosure, in a case where opposite ends of the gate stacks need to be isolated, corresponding positions may be shielded by the photoresist 1033', thereby leaving dummy gates at the corresponding positions for isolation. For example, as shown in FIGS. 18(a) (see the dotted elliptical circle on the right side in this figure) and 18(c), at a position where the fourth dummy gate numbered from left to right is located, the photoresist 1033' covers a portion of the dummy gate of a certain width in the second direction, and the portion of the dummy gate 1019 of the width is subsequently kept.

In addition, according to an embodiment of the present disclosure, in a case where opposite ends of the gate stacks (particularly, gate stacks of the n-type device and the p-type device) need to be isolated, corresponding positions may be shielded by an overlay between the photoresist 1033' and the previous photoresist 1033, thereby leaving dummy gates at the corresponding positions for isolation. For example, as shown in FIGS. 18(a) (see the dotted elliptical circle on the left side in this figure) and 18(d), at the second dummy gate numbered from left to right, the photoresist 1033' overlaps with the previous photoresist 1033 by a certain width in the second direction, and the portion of the dummy gate 1019 of the width is subsequently kept.

Figure 19A:
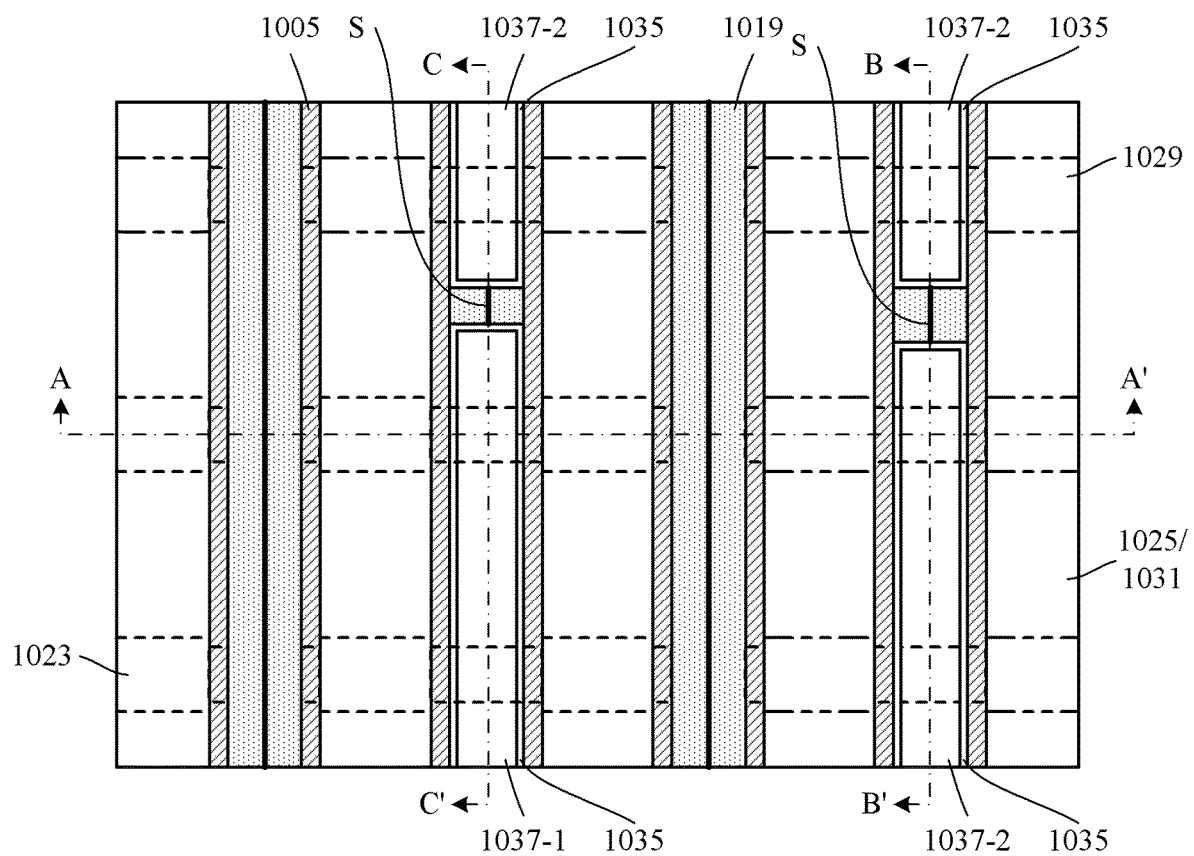
Figure 19B:
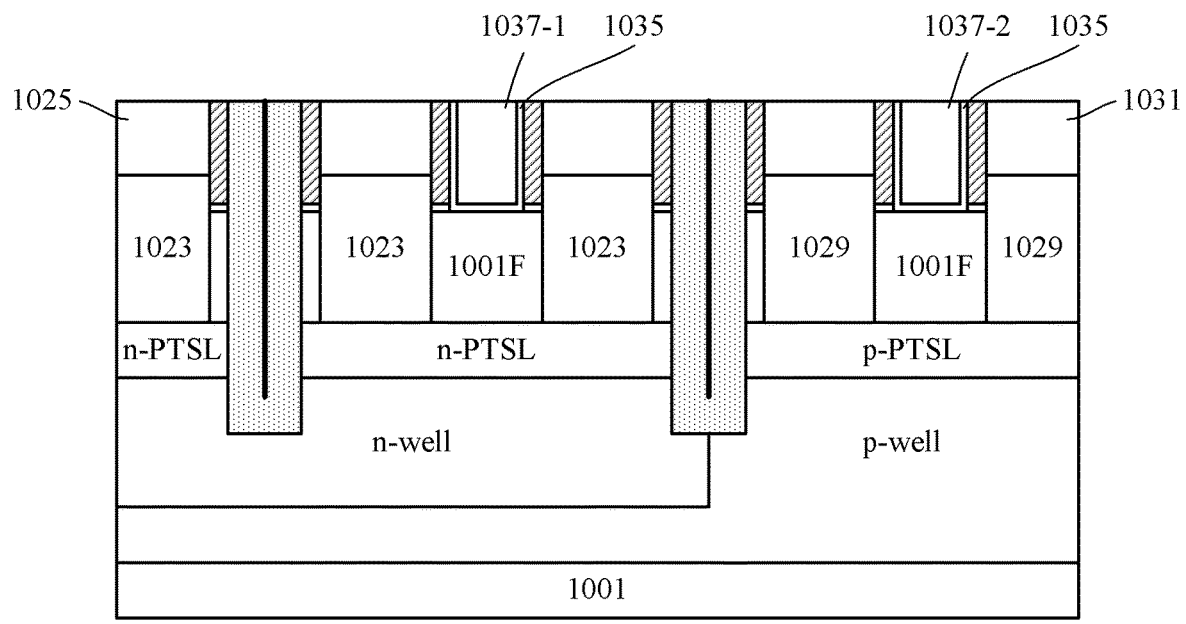
Figure 19C:
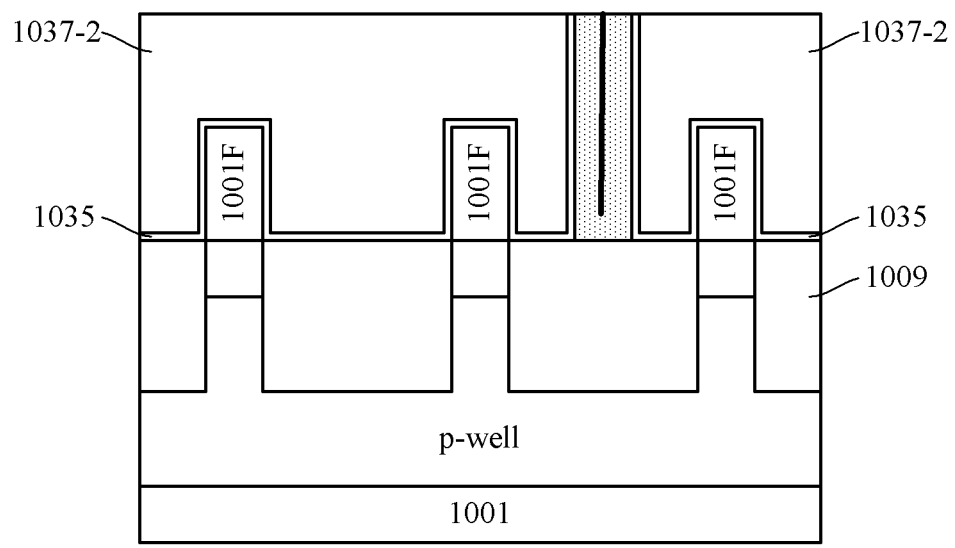
Figure 19D:
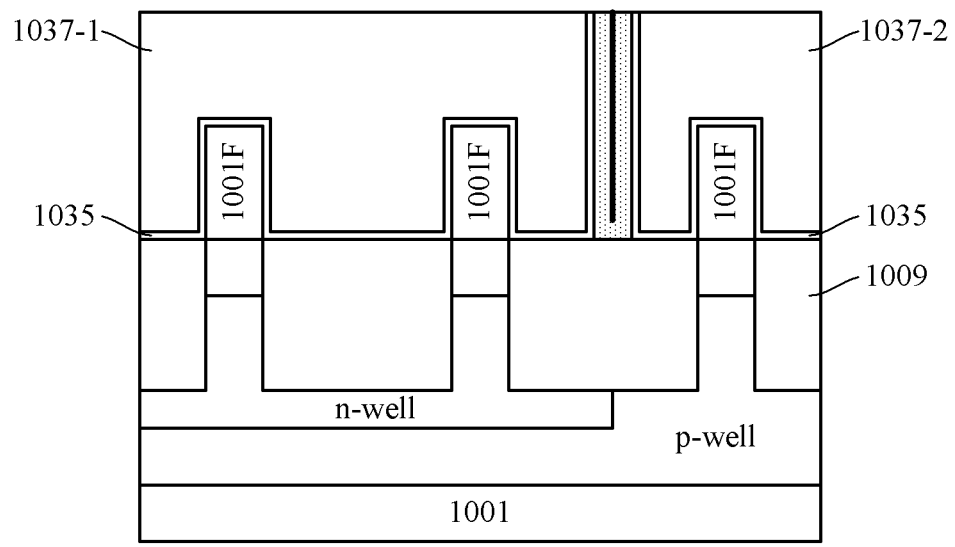

Then, as shown in FIGS. 19(a), 19(b), 19(c) and 19(d) (FIG. 19(a) is a top view, FIG. 19(b) is a cross-sectional view taken along line AA' in FIG. 19(a), FIG. 19(c) is a cross-sectional view taken along line BB' in FIG. 19(a), and FIG. 19(d) is a cross-sectional view taken along line CC' in FIG. 19(a)), gate stacks are formed in spaces left within the spacers 1005. Here, gate stacks for the n-type devices may be formed.

For example, a gate dielectric layer 1035 may be formed in the spaces by deposition such as ALD. The gate dielectric layer 1035 may include high-k gate dielectric such as $HfO_2$ with a thickness of about 1-3 nm. Before the gate dielectric layer 1035 is formed, an interface layer (not shown) of oxide, with a thickness of about 0.3-1.2 nm, may be formed on the surfaces of the fins 1001F. After that, a gate electrode layer 1037-2, such as a metal gate electrode, for the n-type devices may be formed by deposition. The formed gate electrode layer 1037-2 and gate dielectric layer 1035 may be planarized by, for example, CMP. The CMP may stop at the dielectric 1025/1031. Thus, the gate electrode layer 1037-2 and the gate dielectric layer 1035 are left in the spacers 1005 to form gate stacks.

Thus, the n-type and p-type FinFETs are obtained. As shown in FIG. 19(*b*), in the p-type FinFETs, the gate electrode layer 1037-1 may control the channel regions in the fins 1001F via the gate dielectric layer 1035, and the source/drain regions 1023 may be electrically connected via the channel regions. Similarly, in the n-type FinFETs, the gate electrode layer 1037-2 may control the channel regions in the fins 1001F via the gate dielectric layer 1035, and the source/drain regions 1029 may be electrically connected via the channel regions.

Here, different gate stacks may be formed for the n-type devices and the p-type devices, respectively (in this example, the same gate dielectric layer is formed and different gate electrode layers are formed for the n-type devices and the p-type devices, but the present disclosure is not limited thereto, for example, different gate dielectric layers are also possible).

As shown in FIGS. 19(*a*) and 19(*c*), a gap between some opposing gate stacks (in other words, a width of the remaining dummy gates 1019 in the second direction) is determined by the line width of the photoresist 1033' here. This gap may be made narrower as compared with the conventional techniques in which a gap between gate stacks is determined by an interval between lines (because the line width is generally less than the line interval in lithography). That is, a distance between opposite ends of the gate stacks may be smaller, thereby saving the area and reducing the manufacturing cost. Further, the remaining dummy gates 1019 in this gap has the seam S therein as described above. The seam S may physically connect the opposing gate stacks.

In addition, as shown in FIGS. 19(*a*) and 19(*d*), an isolation between some opposing gate stacks (or the width of the remaining dummy gates 1019 in the second direction) is determined by the overlay between the photoresist 1033' and the photoresist 1033. This isolation may be made narrower as compared with the conventional techniques in which the feature size is determined by the line width (because the overlay is generally less than the Critical Dimension (CD) in lithography). That is, a distance between opposite ends of the gate stacks may be made smaller, thereby saving the area and reducing the manufacturing cost. Further, the remaining dummy gates 1019 in this gap has the seam S therein as described above. The seam S may physically connect the opposing gate stacks.

Here, two different methods are utilized to achieve a reduction in the gap between the opposite ends of the gate stacks. Whether to use these methods depends on the layout design.

Next, contacts may be manufactured.

Figure 20:
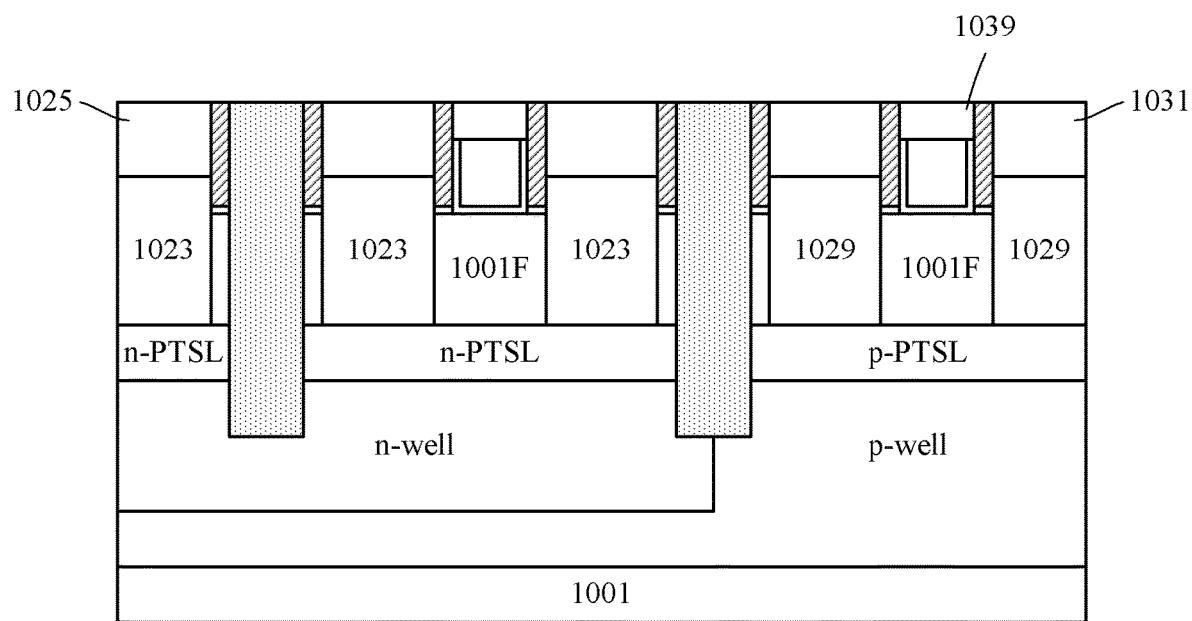

In order to protect the gate stacks, as shown in FIG. 20 (FIG. 20 illustrates the cross-section along line AA'), the gate stacks may be recessed and a protective layer 1039 may be formed on the top thereof. For example, the protective layer 1039 may include nitride.

Figure 21A:
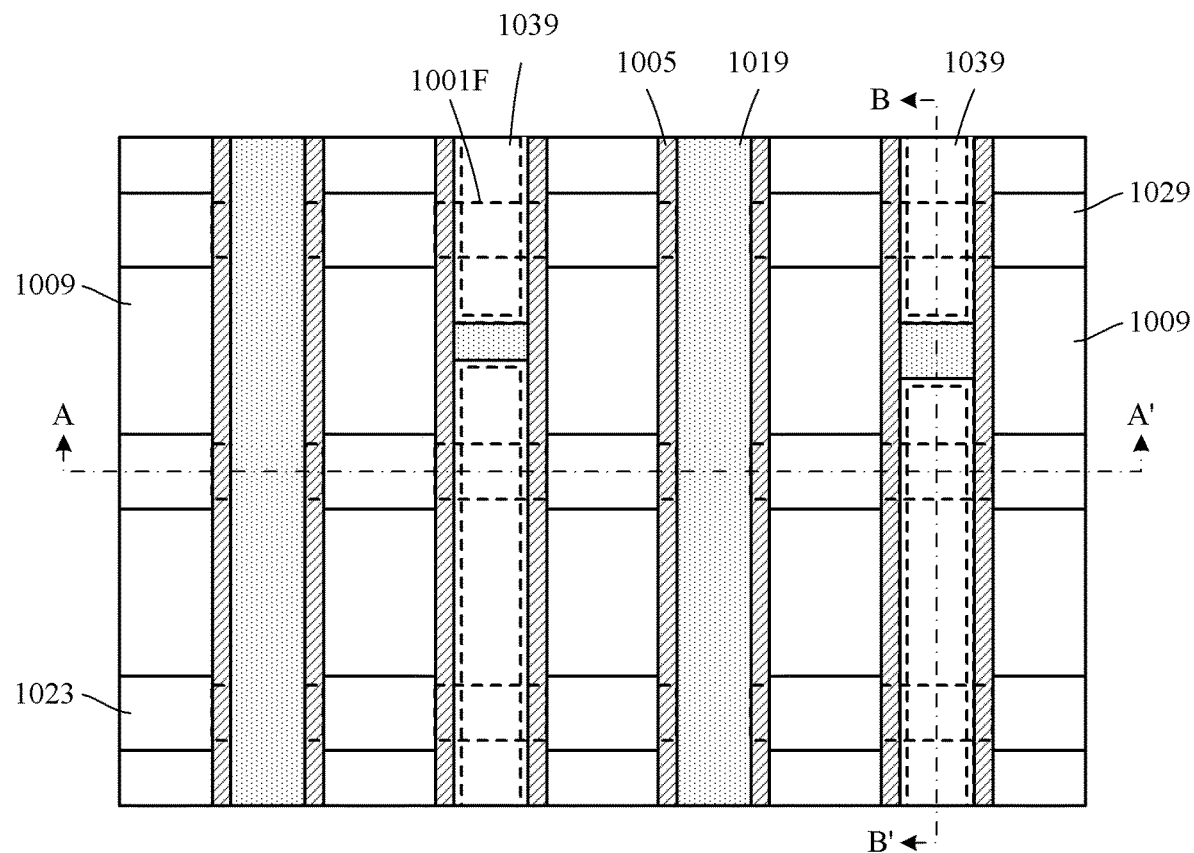
Figure 21B:
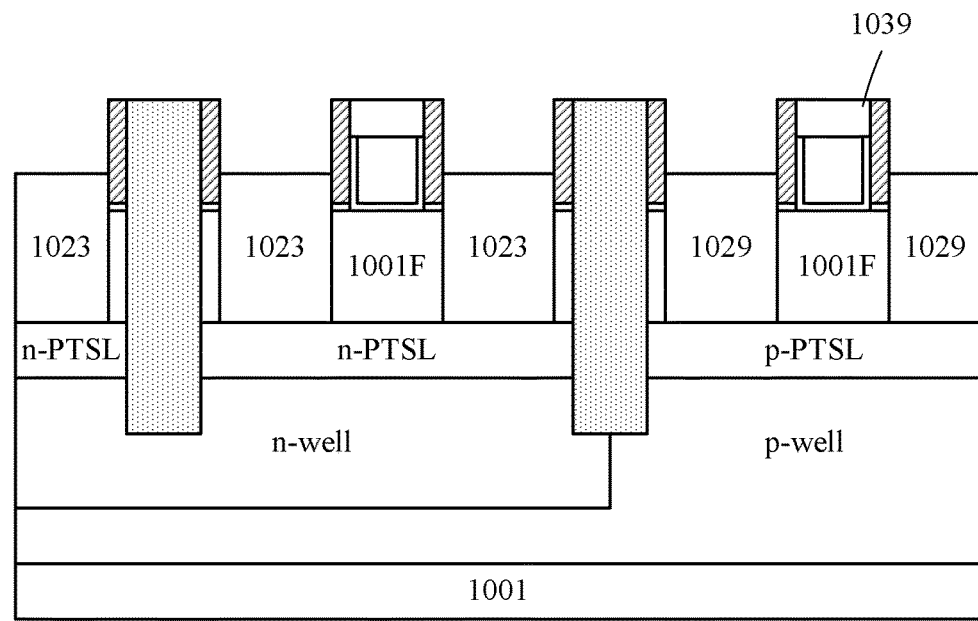

According to an embodiment of the present disclosure, the contacts are formed in a self-alignment manner. For example, as shown in FIGS. 21(*a*) and 21(*b*) (FIG. 21(*a*) is a top view, and FIG. 21(*b*) is a cross-sectional view taken along line AA' in FIG. 21(*a*)), the dielectric 1025/1031 (of, in this example, oxide) may be selectively etched by, for example, wet etching or vapor phase etching (with respect to the semiconductor material 1023/1029, the dummy gates of oxynitride, and the spacers 1005 and the protective layer 1039 of nitride), to at least partially expose the underlying source/drain regions 1023, 1029. Such etching may be isotropic etching, and trenches or holes resulting from the etching may at least partially be substantially conformal to or substantially aligned with outer walls of a portion of the spacers 1005. FIG. 21(*a*) illustrates etching of the dielectric 1025/1031 to expose the underlying isolation layer 1009. However, the present disclosure is not limited thereto. For example, a portion of the dielectric 1025/1031 may be still left as long as the source/drain regions 1023, 1029 are exposed.

Thus, as shown in FIGS. 21(*a*) and 21(*b*), trenches are left between adjacent ones of the spacers 1005. These trenches may then accommodate a conductive material to form the contacts. Since the source/drain regions 1023, 1029 are located in these trenches, the contacts may be self-aligned to the source/drain regions 1023, 1029.

Figure 22A:
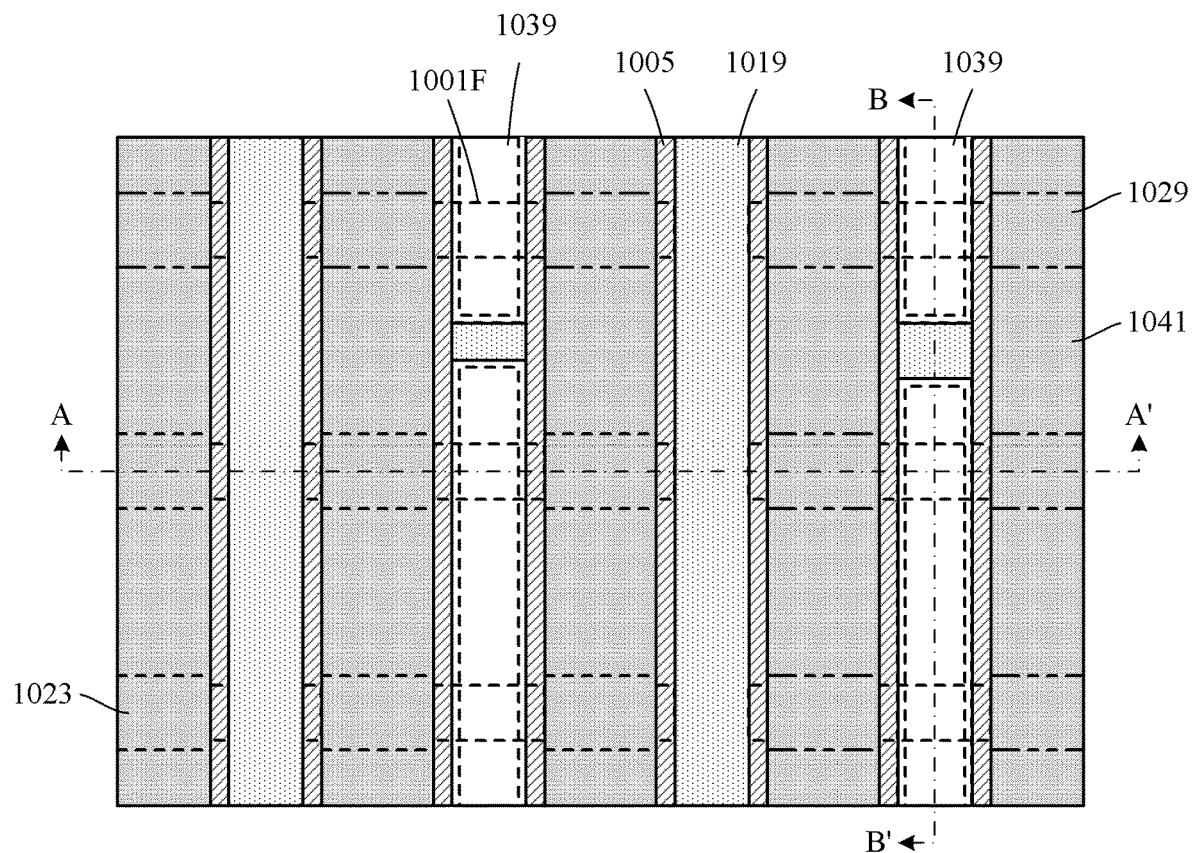
Figure 22B:
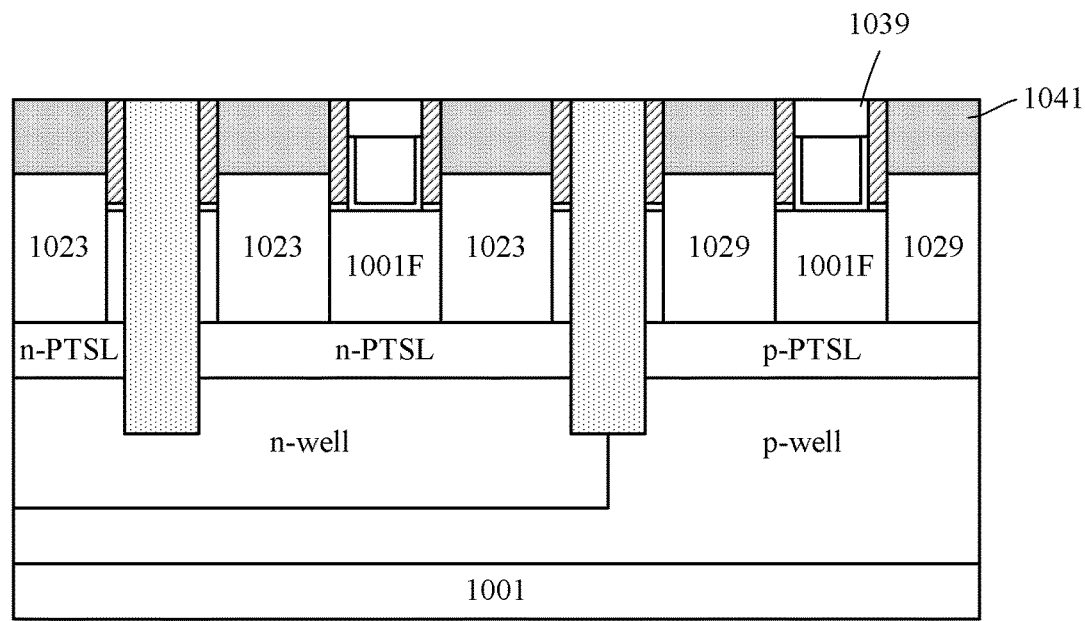

Then, as shown in FIGS. 22(*a*) and 22(*b*) (FIG. 22(*a*) is a top view, and FIG. 22(*b*) is a cross-sectional view taken along line AA' in FIG. 22(*a*)), a contact material 1041 may be formed on the structure shown in FIGS. 21(*a*) and 21(*b*) by, for example, deposition, and may be planarized by, for example, CMP. The CMP may stop at the spacers 1005 or the protective layer 1039. Thus, the contact material 1041 is filled in each of the trenches. The contact material 1041 may include a conductive material, for example, metal such as W. Portions of the contact material 1041 in the different trenches are isolated from each other due to the respective spacers 1005 therebetween.

In addition, a barrier layer (not shown), for example, a Ti layer or a stack of Ti/TiN, may be formed before the contact material 1041 is formed.

Figure 23A:
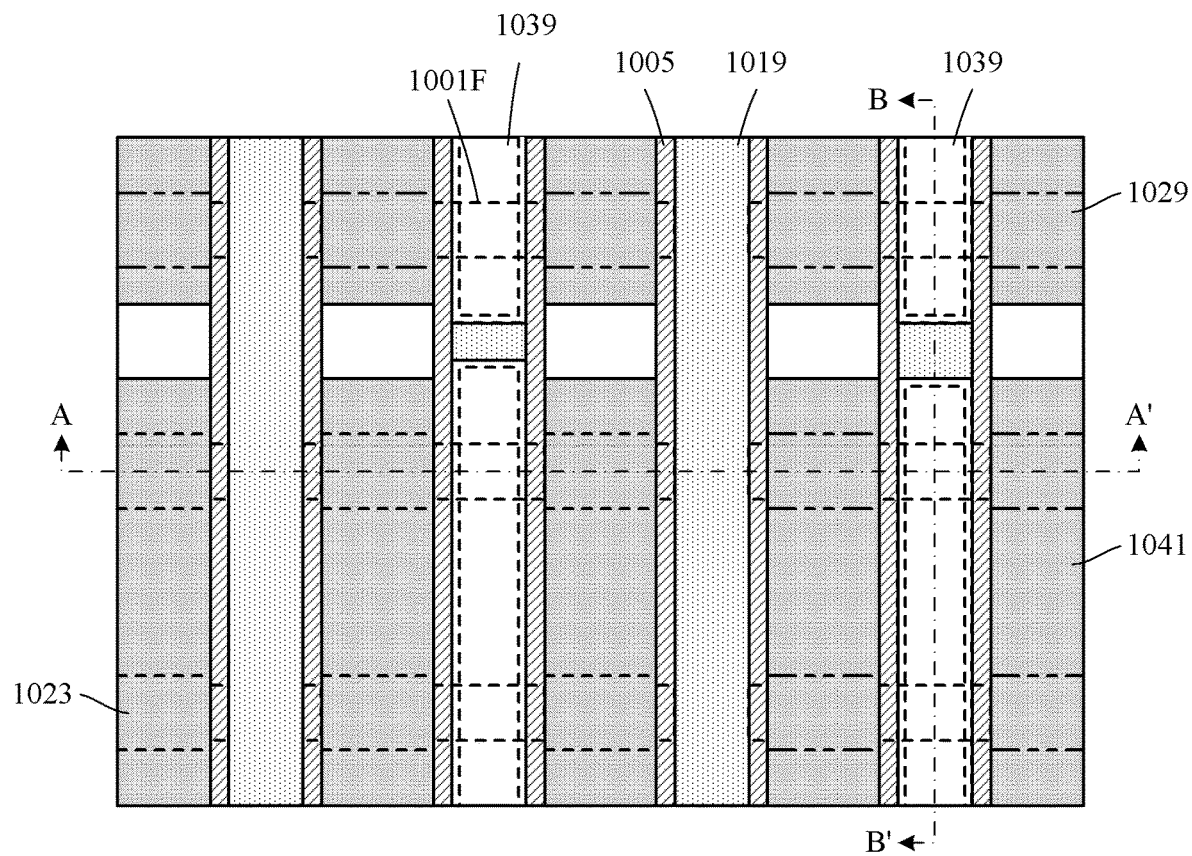
Figure 23B:
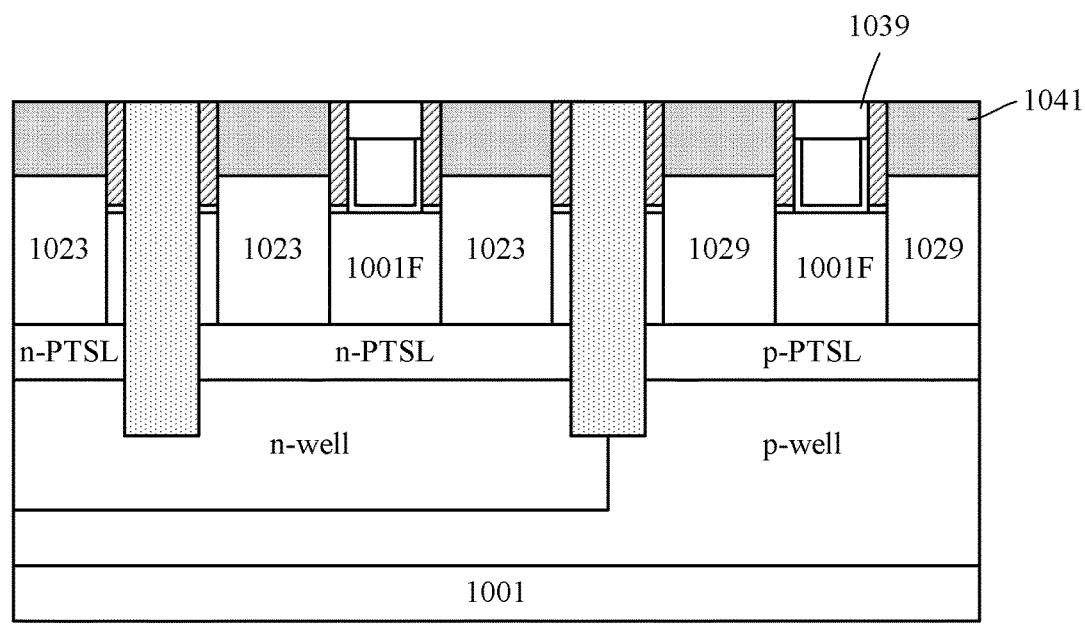

After that, as shown in FIGS. 23(*a*) and 23(*b*) (FIG. 23(*a*) is a top view, and FIG. 23(*b*) is a cross-sectional view taken along line AA' in FIG. 23(*a*)), the contact material 1041 may be separated into different contacts according to the layout design. For example, photoresist (not shown) may be formed on the structure shown in FIGS. 22(*a*) and 22(*b*), and then patterned to expose portions where isolation is needed and shield remaining portions. Then, the contact material 1041 is selectively etched by, for example, RIE, with the photoresist as a mask to cut off the contact material 1041. As shown in FIG. 23(*b*), contacts 1041 which are self-aligned to the source/drain regions 1023, 1029 are formed.

The techniques according to the present disclosure may be applied locally or globally across the substrate.

In the embodiments described above, the gate electrode layer 1037-1 of the p-type devices and the gate electrode layer 1037-2 of the n-type devices are electrically isolated from each other. However, the present disclosure is not limited thereto. For example, the gate electrode layer 1037-1 of the p-type devices and the gate electrode layer 1037-2 of the n-type devices may be electrically connected to each other in some regions according to the layout design.

Figure 24A:
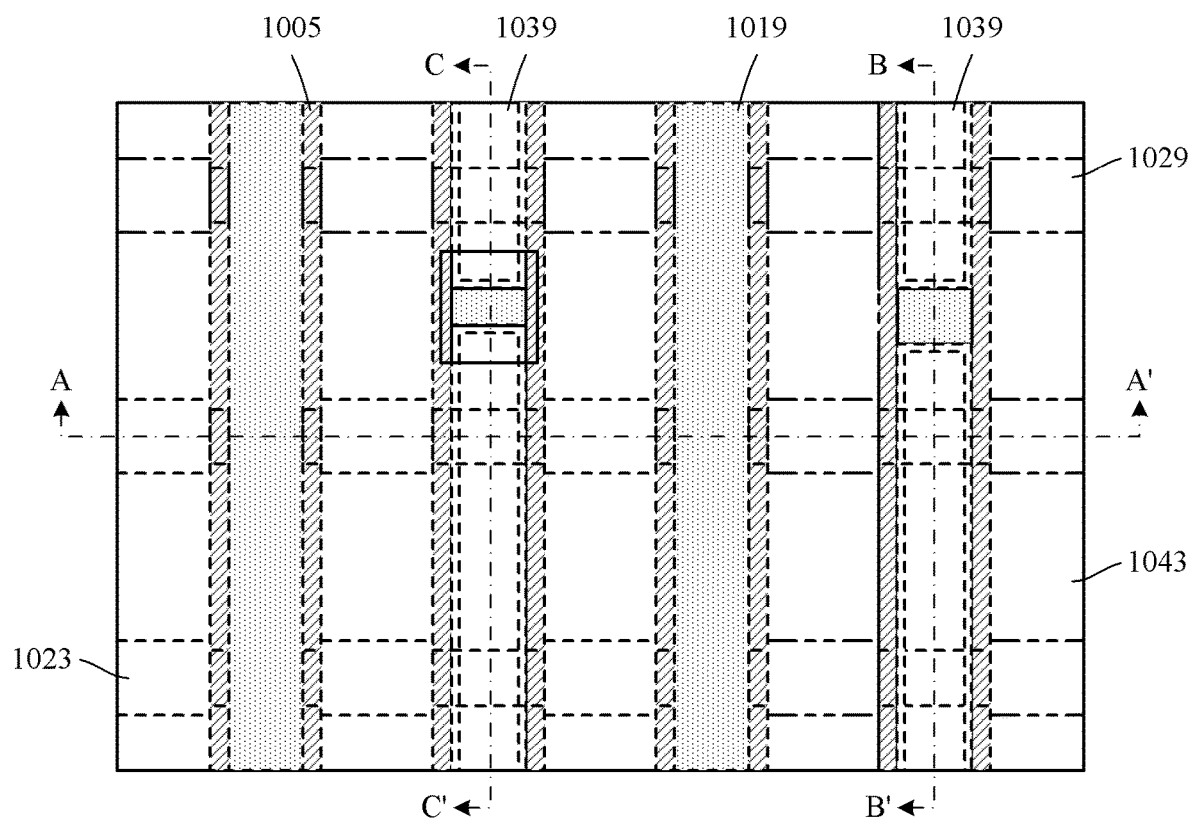
FIGS. 24(a)-26 are schematic views showing some stages in a flow of manufacturing a semiconductor arrangement according to another embodiment of the present disclosure.
Figure 24B:
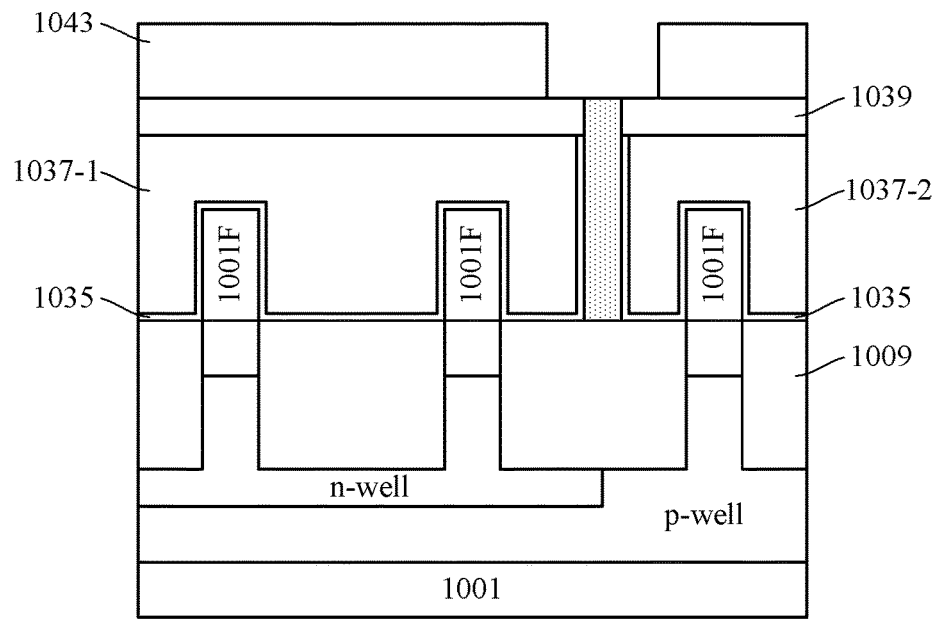

For example, after the operations described above in connection with FIGS. 3(*a*)-20 are performed, as shown in FIGS. 24(*a*) and 24(*b*) (FIG. 24(*a*) is a top view, and FIG. 24(*b*) is a cross-sectional view taken along line CC' in FIG. 24(*a*)), a mask layer 1043 may be formed on the structure shown in FIG. 20. For example, the mask layer 1043 may include nitride, with a thickness of about 10-50 nm. The mask layer 1043 may be patterned (for example, by photolithography) to expose the isolation (i.e., the dummy gate 1019) between the gate electrode layer 1037-1 and the gate electrode layer 1037-2 which need to be electrically connected.

Figure 25:
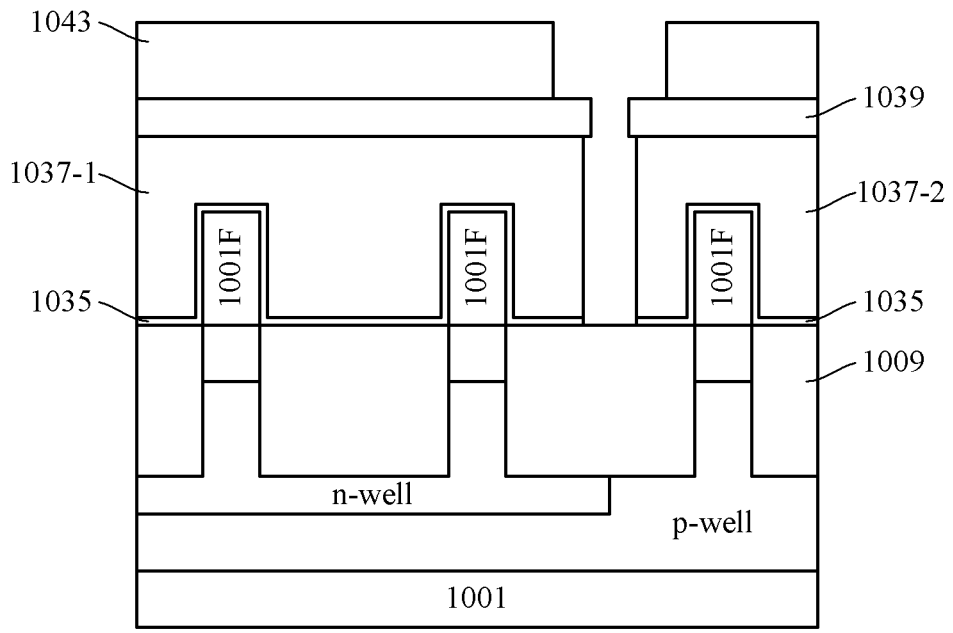

Then, as shown in FIG. 25 (FIG. 25 illustrates the cross section along CC'), the protective layer 1039 (of, in this example, nitride) and the dummy gates 1019 (of, in this example, oxynitride) may be selectively etched using the mask layer 1043. Here, the gate dielectric layer 1035 may also be selectively etched. Thus, a gap is left between the gate electrode layer 1037-1 and the gate electrode layer 1037-2.

Figure 26:
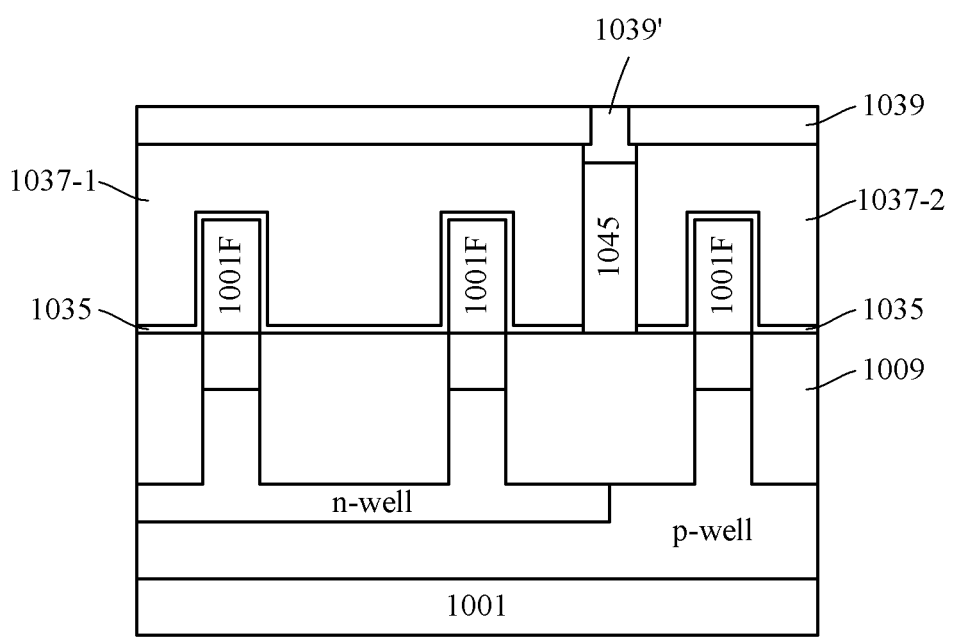

Subsequently, as shown in FIG. 26 (FIG. 26 illustrates the cross section along CC'), the gap may be filled with a conductive material 1045 such as W so as to electrically connect the gate electrode layer 1037-1 to the gate electrode layer 1037-2. Preferably, the filled conductive material 1045 has a top surface at a level not higher than that of the top surfaces of the gate electrode layers 1037-1, 1037-2. Dielectric 1039', such as nitride, may then be filled into remaining spaces in the gap. The nitride may be planarized by, for example, CMP.

After that, the contacts may be manufactured as in the embodiments described above.

In the embodiments described above, the p-type device region and the n-type device region are processed separately to adopt the strained source/drain technique. However, the present disclosure is not limited thereto. For example, portions of the ridges corresponding to the source/drain regions may be all replaced with first strained source/drains for one type of devices (for example, the p-type devices) on both the regions, and then the first strained source/drains on the region for another type of devices (for example, the n-type devices) are replaced with second strained source/drains for such a type of devices.

Figure 28A:
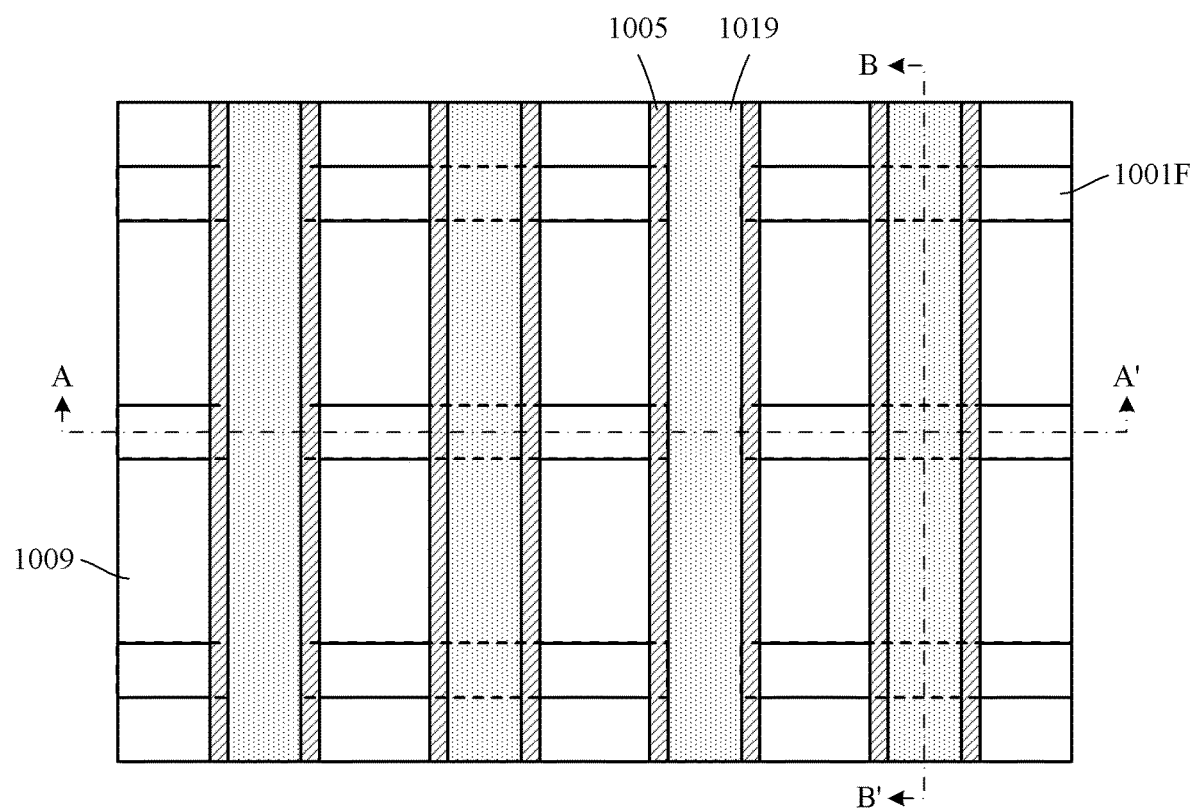
FIGS. 28(a)-33 are schematic views showing some stages in a flow of manufacturing a semiconductor arrangement according to yet another embodiment of the present disclosure.
Figure 28B:
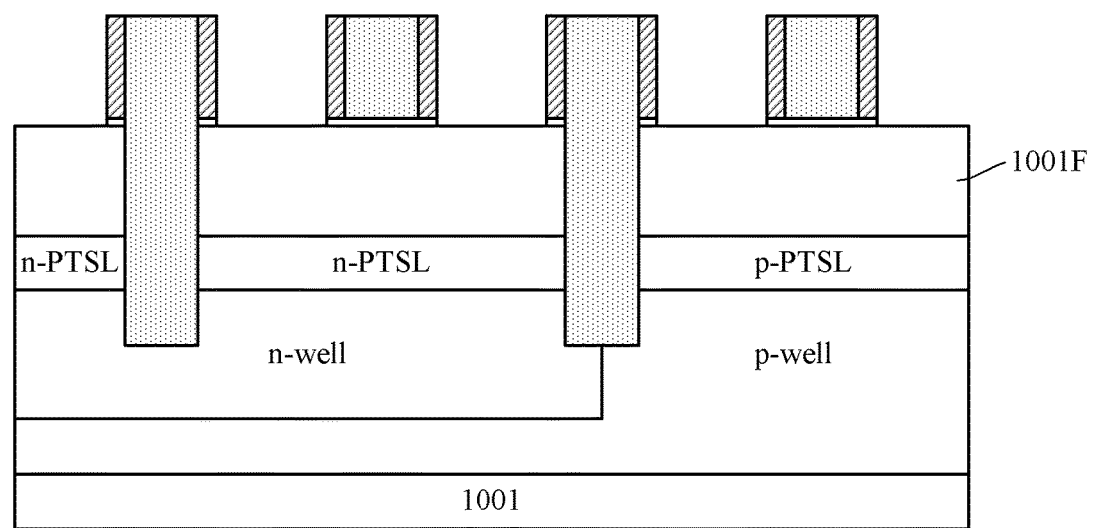

As shown in FIGS. 28(a) and 28(b) (FIG. 28(a) is a top view, and FIG. 28(b) is a cross-sectional view taken along line AA' in FIG. 28(a)), after the dummy gates 1019 are formed as described above in conjunction with FIGS. 9(a) and 9(b), the first dielectric 1015 and the etching stopper layer 1011 of oxide may be selectively etched by, for example, RIE, on the entire substrate to expose the underlying fins 1001F. Thus, portions (corresponding to the source/drain regions) of the fins 1001F extending between adjacent ones of the spacers 1005 in the p-type device region and the n-type device region are all exposed. This operation is similar to that described above in conjunction with FIGS. 10(a) and 10(b), but without the photoresist 1021.

Figure 29A:
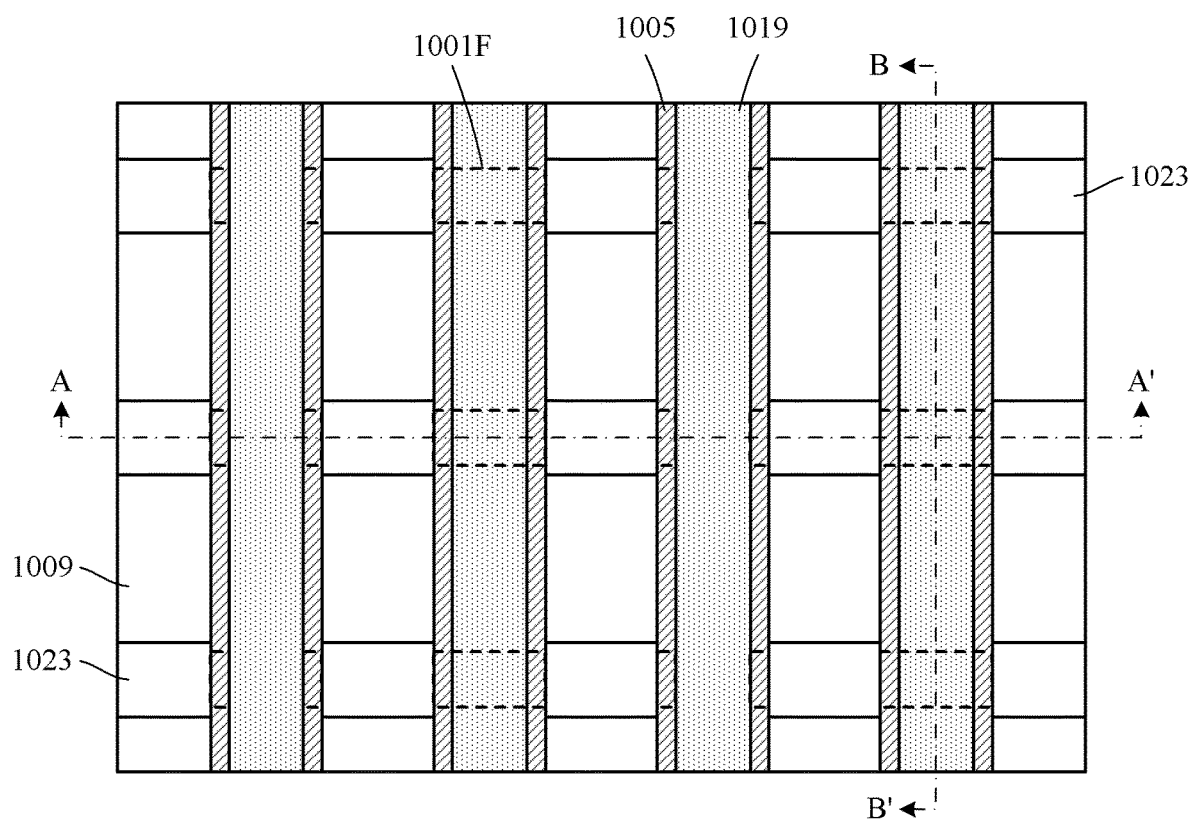
Figure 29B:
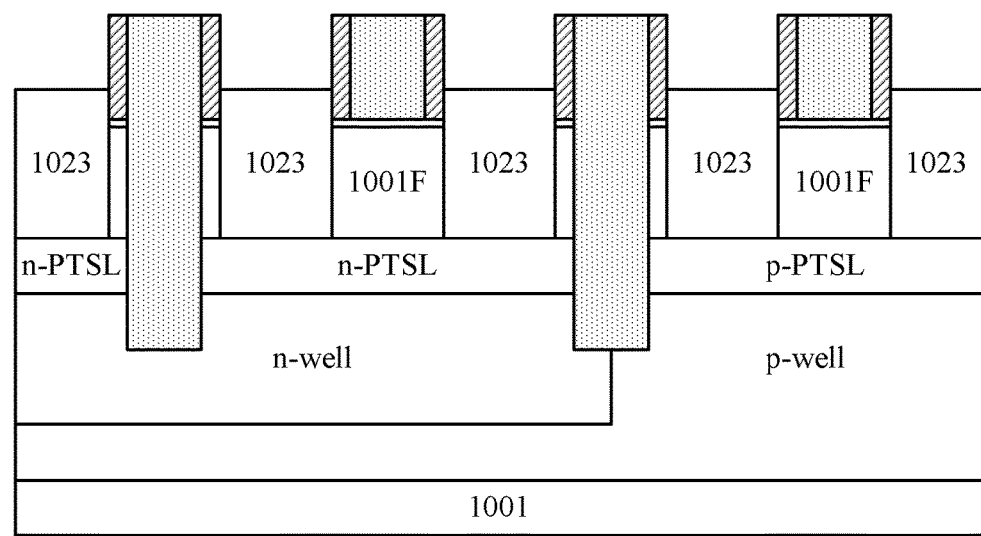

Next, as shown in FIGS. 29(a) and 29(b) (FIG. 29(a) is a top view, and FIG. 29(b) is a cross-sectional view taken along line AA' in FIG. 29(a)), the fins 1001F may be selectively etched by, for example, RIE to remove at least a portion thereof so that the fins 1001F are recessed. Then, a further semiconductor material 1023 serving as source/drain regions of the p-type devices may be epitaxially grown with remaining portions of the fins 1001F as a seed. To this end, for example, reference may be made to the above description in conjunction with FIGS. 11(a) and 11(b).

Figure 30:
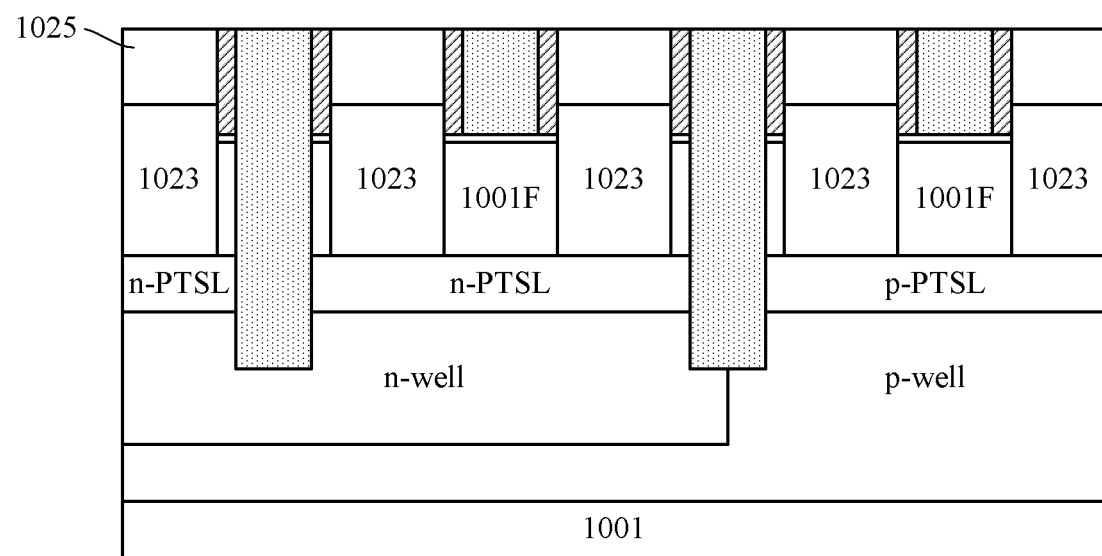

Then, as shown in FIG. 30 (FIG. 30 illustrates the cross section along line AA'), third dielectric 1025 of, for example, oxide may be formed on the structure shown in FIGS. 29(a) and 29(b), by, for example, deposition, and then planarized by, for example, CMP. The CMP may stop at the spacers 1005.

Next, the semiconductor material 1023 in the n-type device region may be replaced.

Figure 31A:
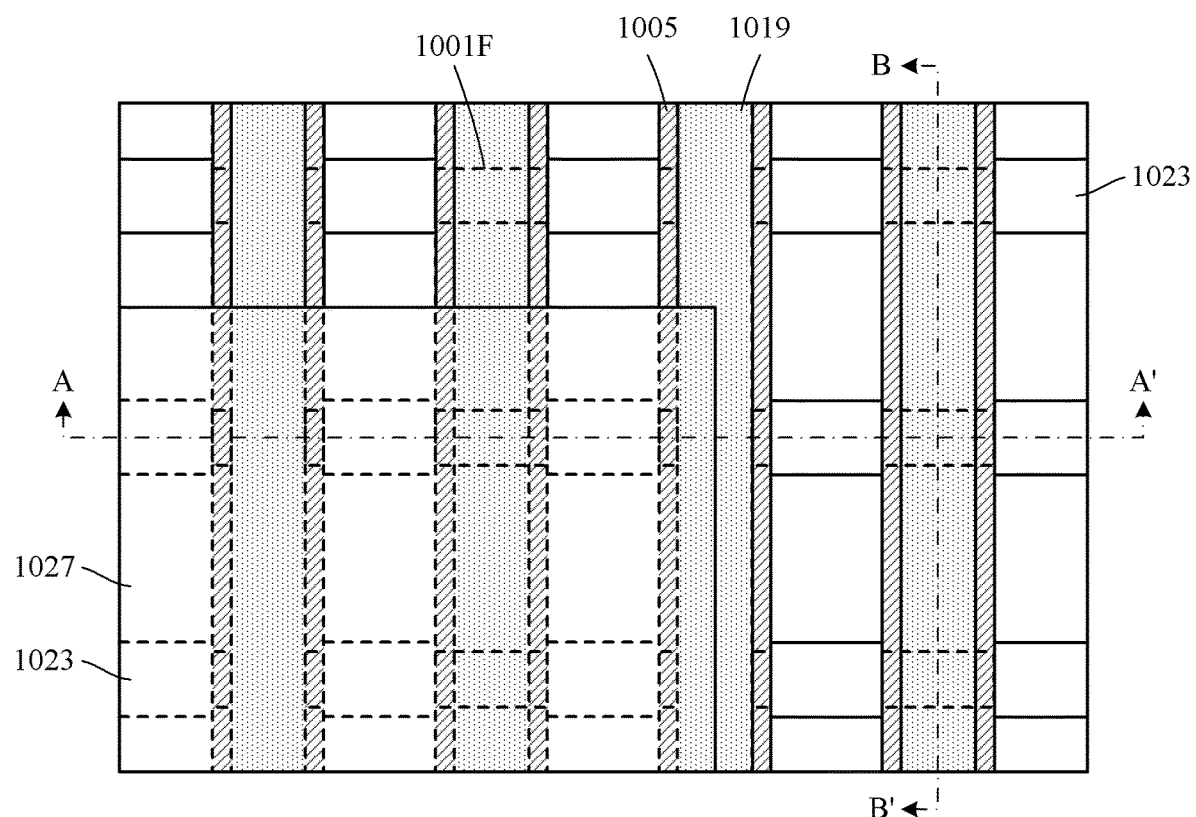
Figure 31B:
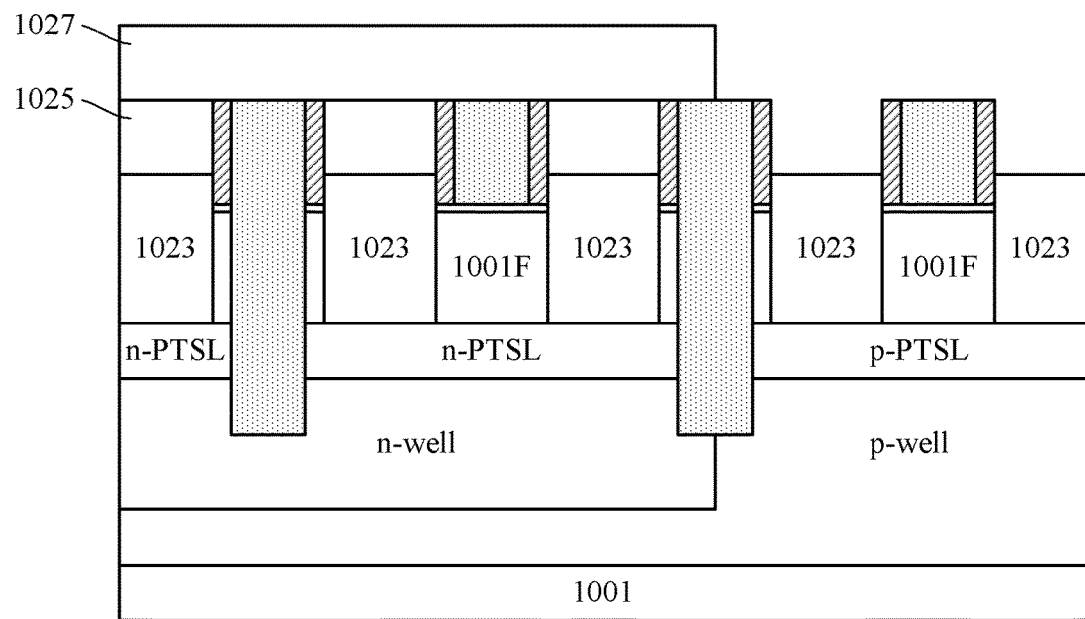

To this end, as shown in FIGS. 31(a) and 31(b) (FIG. 31(a) is a top view, and FIG. 31(b) is a cross-sectional view taken along line AA' in FIG. 31(a)), photoresist 1027 may formed on the structure shown in FIG. 30, and then patterned to shield the p-type device region (for example, the lower left portion in FIG. 31(a)) while exposing the n-type device region (for example, the upper left portion and the right portion in FIG. 31(a)). The third dielectric 1025 of oxide is selectively etched by, for example, RIE, with the photoresist 1027 as a mask to expose the underlying fins 1001F. Thus, portions (corresponding to the source/drain regions) of the fins 1001F extending between adjacent ones of the spacers 1005 in the n-type device region are exposed. After that, the photoresist 1027 may be removed.

Figure 32:
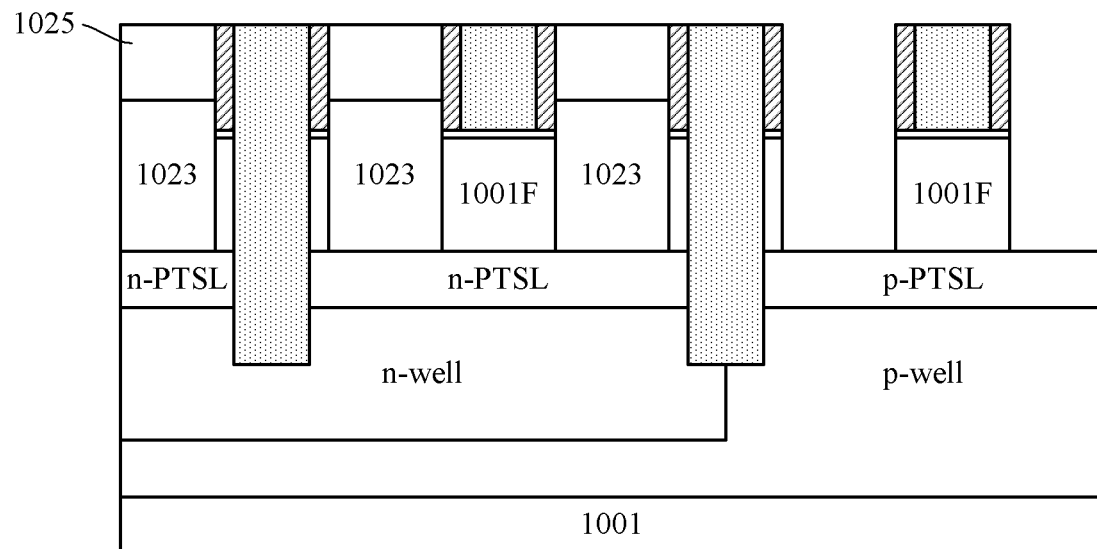
Figure 33:
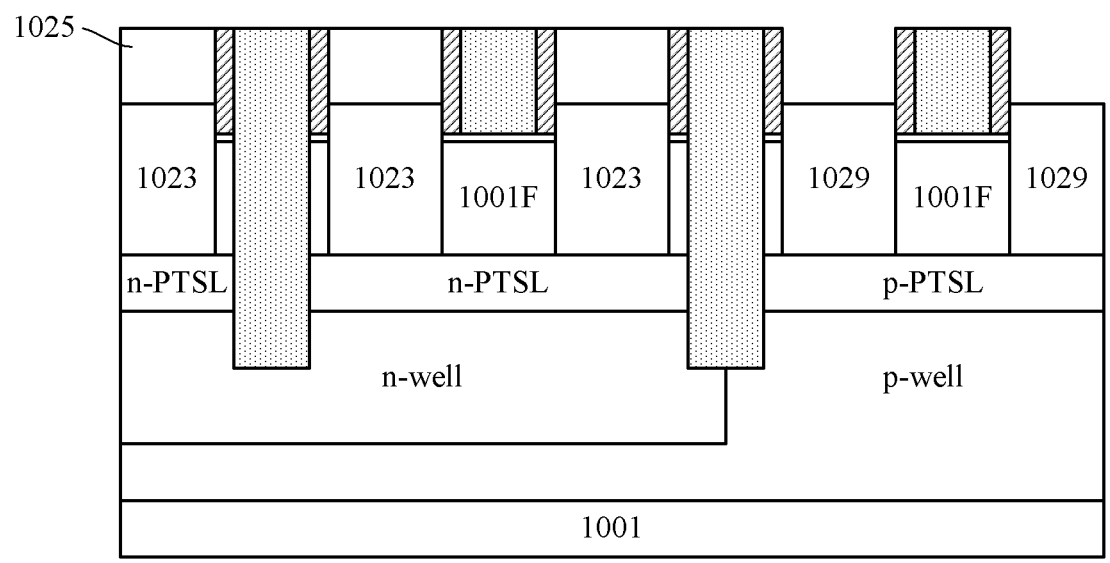

Next, as shown in FIG. 32 (FIG. 32 illustrates the cross section along line AA'), the fins 1001F may be selectively etched by, for example, RIE to remove at least a portion thereof so that the fins 1001F are recessed. Then, as shown in FIG. 33 (FIG. 33 illustrates the cross section along line AA'), a further semiconductor material 1029 serving as the source/drain regions of the n-type devices may be epitaxially grown with the remaining portions of the fins 1001F as a seed. To this end, for example, reference may be made to the above description in conjunction with FIG. 14. Next, the process may be performed as in the embodiments described above.

The semiconductor arrangement according to the embodiments of the present disclosure are applicable to various electronic devices. For example, an Integrated Circuit (IC) may be formed by integrating such a semiconductor arrangement and other devices (for example, other forms of transistors, etc.), and an electronic device may be constructed therefrom. Therefore, the present disclosure further provides an electronic device including the above semiconductor arrangement. The electronic device may further include components such as a display screen operatively coupled to the integrated circuit and a wireless transceiver operatively coupled to the integrated circuit. Such an electronic device includes, for example, an intelligent phone, a computer, a tablet Personal Computer (PC), a wearable intelligent device, a mobile power supply, a robot, an intelligent chip, or the like.

In the above description, technical details such as patterning and etching of the respective layers have not been described in detail. However, it will be understood by those skilled in the art that layers, regions, or the like of a desired shape may be formed by various technical means. In addition, in order to form the same structure, those skilled in the art may also design a method which is not exactly the same as the method described above. In addition, although various embodiments have been separately described above, it does not mean that the measures in the various embodiments cannot be used in combination to advantage.

The embodiments of the present disclosure have been described above. However, these embodiments are for illustrative purposes only and are not intended to limit the scope of the present disclosure. The scope of the present disclosure is defined by the appended claims and their equivalents. Numerous substitutions and modifications may be made by those skilled in the art without departing from the scope of the present disclosure, and these substitutions and modifications shall fall within the scope of the present disclosure.

We claim:

1. A semiconductor arrangement, comprising:
    a substrate;
    a plurality of fins formed on the substrate and extending in a first direction;
    a plurality of gate stacks formed on the substrate and extending in a second direction crossing the first direction, wherein at least one of the gate stacks intersects at least one of the fins;
    spacers formed on sidewalls of the gate stacks; and dielectric disposed between a first one and a second one of the gate stacks which are aligned in the second direction to electrically isolate the first gate stack from the second gate stack, wherein the first gate stack and the second gate stack have their respective spacers extending integrally, and the dielectric is disposed in a space defined at least partially by the spacers of the first gate stack and the second gate stack which extend integrally, and wherein the dielectric has a seam formed therein and extending substantially in the second direction.

2. The semiconductor arrangement according to claim 1, wherein the seam is positioned in substantially the middle of the dielectric in the first direction.

3. The semiconductor arrangement according to claim 1, wherein the seam extends from a first sidewall of the first gate stack to a second sidewall of the second gate stack, the first sidewall and the second sidewall opposite to each other in the second direction.

4. The semiconductor arrangement according to claim 1, wherein at least a portion of an interval between the first gate stack and the second gate stack in the second direction is less than a line interval achievable by lithography in a process of manufacturing the semiconductor arrangement.

5. The semiconductor arrangement according to claim 1, wherein the dielectric has a dimension in the second direction less than a Critical Dimension (CD) achievable by lithography in the process of manufacturing the semiconductor arrangement.

6. The semiconductor arrangement according to claim 1, further comprising:
dummy gates composed of dielectric and extending in the second direction
wherein the spacers are also formed on sidewalls of the dummy gates.

7. The semiconductor arrangement according to claim 6, wherein at least some of the fins have ends abutting the dummy gates and substantially aligned with inner walls of corresponding ones of the spacers.

8. The semiconductor arrangement according to claim 6, wherein at least one of the gate stacks and at least one of the dummy gates which are aligned in the second direction have their respective spacers extending integrally.

9. The semiconductor arrangement according to claim 1, wherein each of the spacers extends continuously in the second direction across the plurality of fins.

10. The semiconductor arrangement according to claim 6, wherein the dielectric between the first gate stack and the second gate stack is the same as that of the dummy gates.

11. The semiconductor arrangement according to claim 1, further comprising an electrical contact disposed between adjacent ones of the spacers.

12. The semiconductor arrangement according to claim 11, wherein sidewalls of the electrical contact are substantially conformal to or substantially aligned with outer walls of a portion of the spacers facing the electrical contact.

13. The semiconductor arrangement according to claim 1, wherein at least one of the fins comprises:
a first portion of a first semiconductor material extending directly under the gate stacks and the spacers; and
a second portion of a second semiconductor material extending between the respective spacers and abutting the first portion,
wherein the second semiconductor material is capable of applying stress to the first semiconductor material.

14. The semiconductor arrangement according to claim 13, wherein the second portion has a top surface at a level higher than that of the first portion but lower than that of the spacers.

15. The semiconductor arrangement according to claim 6, wherein the dielectric of each of the dummy gates constitutes a U-shaped structure.

16. A method of manufacturing a semiconductor arrangement, comprising operations of:
forming, on a substrate, a plurality of ridges each extending in a first direction;
forming, on the substrate, a plurality of sacrificial gate lines each extending continuously in a second direction crossing the first direction to intersect the plurality of ridges;
forming a spacer on sidewalls of each of the sacrificial gate lines to surround the sacrificial gate line;
forming first dielectric on the substrate, and planarizing the first dielectric to expose the sacrificial gate lines;
removing the sacrificial gate lines to expose the underlying ridges;
filling spaces within the spacers with second dielectric, wherein the second dielectric has a seam formed therein and extending substantially in the second direction;
shielding a portion of the second dielectric with a mask and exposing remaining portions of the second dielectric, wherein the mask covers a portion of the second dielectric of a certain dimension in the second direction at at least one of the sacrificial gate lines;
removing the exposed portions of the second dielectric to expose the underlying ridges; and
forming gate stacks in a space left by the removal of the portions of the second dielectric,
wherein at the at least one of the sacrificial gate lines, the portion of the second dielectric of the dimension remains, with the seam extending therein.

17. The method according to claim 16, wherein an interval between gate stacks formed on opposite sides of the remaining portion of the second dielectric in the second direction is defined by the dimension and can therefore be less than a line interval achievable by lithography in a process of manufacturing the semiconductor arrangement.

18. The method according to claim 16, wherein the filling of the second dielectric occurs from opposite sidewalls of the spacers, leaving the seam between the opposite sidewalls.

19. A method of manufacturing a semiconductor arrangement, comprising operations of:
forming, on a substrate, a plurality of ridges each extending in a first direction;
forming, on the substrate, a plurality of sacrificial gate lines each extending continuously in a second direction crossing the first direction to intersect the plurality of ridges;
forming a spacer on sidewalls of each of the sacrificial gate lines to surround the sacrificial gate line;
forming first dielectric on the substrate, and planarizing the first dielectric to expose the sacrificial gate lines;
removing the sacrificial gate lines to expose the underlying ridges;
filling spaces within the spacers with second dielectric, wherein the second dielectric has a seam formed therein and extending substantially in the second direction;

shielding a portion of the second dielectric with a first mask and exposing a first portion of the second dielectric;

removing the exposed first portion of the second dielectric to expose the underlying ridges;

forming a first gate stack in a space left by the removal of the first portion of the second dielectric;

shielding a portion of the second dielectric with a second mask and exposing a second portion of the second dielectric, wherein there is an overlay between the first mask and the second mask of a certain dimension in the second direction at at least one of the sacrificial gate lines;

removing the exposed second portion of the second dielectric to expose the underlying ridges;

forming a second gate stack in a space left by the removal of the second portion of the second dielectric, wherein, at the at least one of the sacrificial gate lines, a portion of the second dielectric corresponding to the overlay of the dimension remains, with the seam extending therein.

20. The method according to claim 19, wherein the dimension can be less than a Critical Dimension (CD) achievable by photolithography in a process of manufacturing the semiconductor arrangement.

21. The method according to claim 20, wherein the filling of the second dielectric occurs from opposite sidewalls of the spacers, leaving the seam between the opposite sidewalls.

\* \* \* \* \*